(12) United States Patent
Jeon et al.

(10) Patent No.: US 11,600,755 B2
(45) Date of Patent: Mar. 7, 2023

(54) SEMICONDUCTOR LIGHT-EMITTING DEVICE AND MANUFACTURING METHOD THEREFOR

(71) Applicant: SEMICON LIGHT CO., LTD., Gyeonggi-do (KR)

(72) Inventors: Soo Kun Jeon, Gyeonggi-do (KR); Young Un Gil, Gyeonggi-do (KR)

(73) Assignee: SEMICON LIGHT CO., LTD., Gyeonggi-do (KR)

( * ) Notice: Subject to any disclaimer, the term of this patent is extended or adjusted under 35 U.S.C. 154(b) by 244 days.

(21) Appl. No.: 16/964,091

(22) PCT Filed: Apr. 23, 2019

(86) PCT No.: PCT/KR2019/004910
§ 371 (c)(1),
(2) Date: Jul. 22, 2020

(87) PCT Pub. No.: WO2020/009319
PCT Pub. Date: Jan. 9, 2020

(65) Prior Publication Data
US 2020/0350481 A1    Nov. 5, 2020

(30) Foreign Application Priority Data

Jul. 5, 2018  (KR) .................. 10-2018-0078067
Jul. 24, 2018  (KR) .................. 10-2018-0085968
(Continued)

(51) Int. Cl.
*H01L 33/62*  (2010.01)
*H01L 33/24*  (2010.01)
*H01L 33/38*  (2010.01)

(52) U.S. Cl.
CPC .............. *H01L 33/62* (2013.01); *H01L 33/24* (2013.01); *H01L 33/382* (2013.01)

(58) Field of Classification Search
CPC ....... H01L 33/62; H01L 33/24; H01L 33/382; H01L 33/36; H01L 33/20
See application file for complete search history.

(56) References Cited

U.S. PATENT DOCUMENTS 5,877,558 A * 3/1999 Nakamura .......... H01L 31/1884
                                                                257/769
6,518,598 B1  2/2003 Chen
(Continued)

FOREIGN PATENT DOCUMENTS

JP  2003-197967 A  7/2003
KR  10-2004-0074328 A  8/2004
(Continued)

OTHER PUBLICATIONS

International Search Report from corresponding PCT Application No. PCT/KR2019/004910, dated Aug. 9, 2019, with English Translation.

*Primary Examiner* — Su C Kim
(74) *Attorney, Agent, or Firm* — Harness, Dickey & Pierce, P.L.C.

(57) ABSTRACT

Disclosed is a semiconductor light emitting device comprising: a substrate; a first semiconductor layer, which is provided on the substrate and has a first conductivity; an active layer, which is provided on the first semiconductor layer and generates ultraviolet light by electron-hole recombination; a second semiconductor layer, which is provided on the active layer and has a second conductivity different from the first conductivity; a first electrode electrically connected to the first semiconductor layer; a second electrode electrically connected to the second semiconductor layer; a second region that includes a plurality of protruded parts of the active layer and the second semiconductor layer protruded from the first semiconductor layer as seen in cross-sectional
(Continued)

view and recesses between the protruded parts; and a first region surrounding the second region.

9 Claims, 27 Drawing Sheets

(30) Foreign Application Priority Data

| Jul. 24, 2018 | (KR) | .......................... | 10-2018-0085969 |
| Jul. 24, 2018 | (KR) | .......................... | 10-2018-0085971 |
| Sep. 21, 2018 | (KR) | .......................... | 10-2018-0114086 |

(56) References Cited

U.S. PATENT DOCUMENTS

| 2009/0101926 A1* | 4/2009 | Lee | .......................... H01L 33/20 |
| | | | 257/E33.001 |
| 2011/0215294 A1* | 9/2011 | Suzuki | .................... H01L 33/06 |
| | | | 257/E33.068 |
| 2017/0263817 A1* | 9/2017 | Hirano | .................. H01L 21/288 |

FOREIGN PATENT DOCUMENTS

| KR | 10-0655163 B1 | 12/2006 |
| KR | 10-2012-0006410 A | 1/2012 |
| KR | 10-2015-0134550 A | 12/2015 |
| KR | 10-2018-0028083 A | 3/2018 |

* cited by examiner

US 11,600,755 B2

SEMICONDUCTOR LIGHT-EMITTING DEVICE AND MANUFACTURING METHOD THEREFOR

CROSS-REFERENCE TO RELATED APPLICATIONS

This application is a national phase application of PCT International Application No. PCT/KR2019/004910, filed on Apr. 23, 2019, which claims priority to Korean Patent Application No. 10-2018-0078067, filed Jul. 5, 2018, Korean Patent Application No. 10-2018-0085968, filed Jul. 24, 2018, Korean Patent Application No. 10-2018-0085969, filed Jul. 24, 2018, Korean Patent Application No. 10-2018-0085971, filed Jul. 24, 2018 and Korean Patent Application No. 10-2018-0114086, filed Sep. 21, 2018. The entire disclosure of the applications identified in this paragraph is incorporated herein by references.

FIELD

The present disclosure relates generally to a semiconductor light emitting device, and more particularly, to a semiconductor light emitting device that emits ultraviolet light.

Also, the present disclosure relates generally to a semiconductor light emitting device, and more particularly, to a semiconductor light emitting device with a higher efficiency of light emission.

Also, the present disclosure relates generally to a semiconductor light emitting device, and more particularly, to a semiconductor light emitting device with an increased luminous efficiency with a lowered operating voltage. In addition, it relates to a method for manufacturing such semiconductor light emitting devices.

BACKGROUND

In the context herein, the term "semiconductor light emitting device" refers to a semiconductor optoelectronic device which generates light by electron-hole recombination. One example thereof is Group III-nitride semiconductor light emitting devices, in which the Group III-nitride semiconductor is composed of a compound containing $Al(x)Ga(y)In(1-x-y)N$ ($0 \leq x \leq 1$, $0 \leq y \leq 1$, $0 \leq x+y \leq 1$). Another example thereof is GaAs-based semiconductor light emitting devices used for emitting red light.

DESCRIPTION OF THE PRIOR ART

This section provides background information related to the present disclosure which is not necessarily prior art.

This section provides background information related to the present disclosure which is not necessarily prior art.

FIG. 1 shows an example of a semiconductor light emitting device in the art.

The semiconductor light emitting device includes a growth substrate 10 (e.g. a sapphire substrate), and a stack of semiconductor layers sequentially deposited on the growth substrate 10, including a buffer layer 20, a first semiconductor layer 30 having a first conductivity (e.g. an n-type GaN layer), an active layer 40 for generating light by electron-hole recombination (e.g. an InGaN/(In)/GaN multiple quantum well (MQW) structure), and a second semiconductor layer 50 having a second conductivity different from the first conductivity (e.g. a p-type GaN layer). The buffer layer 20 can be omitted. The semiconductor light emitting device further includes a light transmitting conductive film 60 for current spreading formed on the second semiconductor layer 50, an electrode 70 serving as a bonding pad formed on the light transmitting conductive film 60, and an electrode 80 serving as a bonding pad (e.g. Cr/Ni/Au metallic pads stacked) formed on an etched exposed portion of the first semiconductor layer 30. This particular type of the semiconductor light emitting device as shown in FIG. 1 is called a lateral chip. Here, one side of the growth substrate 10 serves as a mounting face during electrical connections to outside.

FIG. 2 shows another example of a semiconductor light emitting device disclosed in U.S. Pat. No. 7,262,436. For convenience of description, similar components may have same or different reference numerals.

In this semiconductor light emitting device chip, there is provided a growth substrate 10, and a stack of layers sequentially deposited on the growth substrate 10, including a first semiconductor layer 30 having a first conductivity, an active layer 40 adapted to generate light by electron-hole recombination and a second semiconductor layer 50 having a second conductivity different from the first conductivity. Three-layered electrode films 90, 91 and 92 adapted to reflect light towards the growth substrate 10 are then formed on the second semiconductor layer 50, in which a first electrode film 90 can be a reflecting Ag film, a second electrode film 91 can be a Ni diffusion barrier, and a third electrode film 92 can be an Au bonding layer. Further, an electrode 80 serving as a bonding pad is formed on an etched exposed portion of the first semiconductor layer 30. Here, one side of the electrode film 92 serves as a mounting face during electrical connections to outside. This particular type of the semiconductor light emitting device chip as shown in FIG. 2 is called a flip chip. In this flip chip of FIG. 2, the electrode 80 formed on the first semiconductor layer 30 is placed at a lower height level than the electrode films 90, 91 and 92 formed on the second semiconductor layer 50, but as an alternative, it may be formed at the same height level as the electrode films. Here, height levels are given with respect to the growth substrate 10. Examples of the semiconductor light emitting device may include a lateral chip, a vertical chip, and a flip chip.

FIG. 3 shows another example of a semiconductor light emitting device disclosed in Korean Patent Application Laid-Open No. 2015-0055390. For convenience of description, similar components may have same or different reference numerals.

The semiconductor light emitting device is a flip chip, which includes a growth substrate 10 (e.g. a sapphire substrate), and a stack of semiconductor layers sequentially deposited on the growth substrate 10, including a buffer layer 20, a first semiconductor layer 30 having a first conductivity (e.g. an n-type semiconductor layer), an active layer 40 for generating light by electron-hole recombination (e.g. an InGaN/(In)/GaN MQWs), and a second semiconductor layer 50 having a second conductivity different from the first conductivity (e.g. a p-type semiconductor layer). The buffer layer 20 can be omitted. The flip chip further includes a light transmitting conductive film 60 for current spreading formed on the second semiconductor layer 50, an electrode 70 serving as a bonding pad formed on the light transmitting conductive film 60, and an electrode 80 serving as a bonding pad (e.g. Cr/Ni/Au metallic pads stacked) formed on an etched exposed portion of the first semiconductor layer 30. Moreover, an electrode structure may be provided to lower the operating voltage of the semiconductor light emitting device. This electrode structure includes a first electrode 51 formed on the first semiconductor layer (an n-type semiconductor layer) and a second electrode 52 formed on the second semiconductor layer (a p-type semiconductor layer).

FIG. 4 shows another example of a semiconductor light emitting device disclosed in Korean Patent Application Laid-Open No. 2014-0073160. For convenience of description, similar components may have same or different reference numerals.

As shown, a first semiconductor layer 23, followed by an active layer 25 and a second semiconductor layer 27 may be formed over a substrate 21. The substrate 21 is provided for growing GaN-based semiconductor layers thereon. Examples of the substrate may include a sapphire substrate, a SiC substrate, and a GaN substrate. In particular, the sapphire substrate is preferred.

A plurality of mesas M may be formed on the first semiconductor layer 23, within a certain distance away from each other. Each of the mesas M may include the active layer 25 and the second semiconductor layer 27. The active layer 25 is provided between the first semiconductor layer 23 and the second semiconductor layer 27. Further, reflecting electrodes 30 are arranged on their corresponding mesas M.

As seen from a plan view in FIG. 4A, the first semiconductor layer 23 surrounds the active layer 25 and the second semiconductor layer 27. In particular, the active layer 25 and the second semiconductor layer 27 are similar to islands surrounded by the first semiconductor layer 23.

In recent years, semiconductor ultraviolet light emitting devices have been under active development, and such devices include a plurality of semiconductor layers based on an aluminum gallium nitride (AlGaN) material. However, the AlGaN material has a high sheet resistance, leading to poor current spreading. In addition, ultraviolet light having a shorter wavelength is absorbed by the second semiconductor layer, the electrode, and the pad electrode, which results in an increased temperature as well as a lower light output of the semiconductor light emitting device. Moreover, the semiconductor ultraviolet light emitting device based on AlGaN material has a wider band gap as the wavelength of ultraviolet light decreases. With such a wider band gap, it gets difficult to form an ohmic contact between ohmic electrodes and the semiconductor layers in the formation of the ohmic electrodes for lowering the operating voltage. In the case of a semiconductor ultraviolet light emitting device in the form of a flip chip, the ohmic electrode may include a reflecting layer for reflecting ultraviolet light. However, a certain material of the reflecting layer will not form an ohmic contact, so that an ohmic contact layer should be formed under the reflecting layer. Unfortunately, the ultraviolet light with a shorter wavelength can be absorbed by this ohmic contact layer.

It is an object of the present disclosure to provide a semiconductor light emitting device configured to increase the light emission efficiency of ultraviolet light with a shorter wavelength.

It is another object of the present disclosure to provide a semiconductor ultraviolet light emitting device having an ohmic electrode that can lower an operating voltage and improve the luminous efficiency by reflecting ultraviolet light.

SUMMARY

The problems to be solved by the present disclosure will be described in the latter part of the best mode for carrying out the invention.

This section provides a general summary of the present disclosure and is not a comprehensive disclosure of its full scope or all of its features.

According to one aspect of the present disclosure, there is provided a semiconductor light emitting device comprising: a substrate; a first semiconductor layer, which is provided on the substrate and has a first conductivity; an active layer, which is provided on the first semiconductor layer and generates ultraviolet light by electron-hole recombination; a second semiconductor layer, which is provided on the active layer and has a second conductivity different from the first conductivity; a first electrode electrically connected to the first semiconductor layer; a second electrode electrically connected to the second semiconductor layer; a second region that includes a plurality of protruded parts of the active layer and the second semiconductor layer protruded from the first semiconductor layer as seen in cross-sectional view and recesses between the protruded parts; and a first region surrounding the second region.

According to another aspect of the present disclosure, there is provided a semiconductor light emitting device comprising: a substrate; a first semiconductor layer, which is provided on the substrate and has a first conductivity; an active layer, which is provided on the first semiconductor layer and generates ultraviolet light by electron-hole recombination; a second semiconductor layer, which is provided on the active layer and has a second conductivity different from the first conductivity; a first electrode electrically connected to the first semiconductor layer; a second electrode electrically connected to the second semiconductor layer; an insulating layer formed on the first semiconductor layer, the second semiconductor layer, and the active layer; a first pad electrode, which is formed on the insulating layer and electrically connected to the first electrode; a second pad electrode, which is formed on the insulating layer and electrically connected to the second electrode; and an exposed part, in which the first semiconductor layer surrounds the active layer and the second semiconductor layer as seen in plan view, with the active layer and the second semiconductor layer forming a perimeter, and at least one of the first pad electrode and the second pad electrode is formed to expose the insulating layer, wherein the perimeter and the exposed part are at least partly overlapped as seen in plan view.

According to another aspect of the present disclosure, there is provided a semiconductor light emitting device comprising: a substrate; a first semiconductor layer, which is provided on the substrate and has a first conductivity; an active layer, which is provided on the first semiconductor layer and generates ultraviolet light by electron-hole recombination; a second semiconductor layer, which is provided on the active layer and has a second conductivity different from the first conductivity; a first electrode electrically connected to the first semiconductor layer; a second electrode electrically connected to the second semiconductor layer; and a plurality of regions, in which the first semiconductor layer surrounds the active layer and the second semiconductor layer, with the active layer and the second semiconductor layer forming a perimeter, and in which the active layer at a predefined distance away from the perimeter does not emit ultraviolet light, wherein a passage is present between the regions that has a width smaller than minimum width of the perimeter, passing by the regions.

According to another aspect of the present disclosure, there is provided a semiconductor light emitting device comprising: a substrate; a first semiconductor layer, which is provided on the substrate and has a first conductivity; an active layer, which is provided on the first semiconductor layer and generates ultraviolet light by electron-hole recombination; a second semiconductor layer, which is provided on the active layer and has a second conductivity different from the first conductivity; a first electrode electrically connected to the first semiconductor layer; and a second electrode electrically connected to the second semiconductor layer, wherein the first semiconductor layer surrounds the active layer and the second semiconductor layer as seen in plan view, the active layer and the second semiconductor layer form a perimeter, and the first electrode is formed not to be overlapped with an extension line along the longitudinal direction of the semiconductor light emitting device and the perimeter.

According to another aspect of the present disclosure, there is provided a semiconductor light emitting device comprising: a plurality of semiconductor layers including a first semiconductor layer which has a first conductivity, a second semiconductor layer which has a second conductivity different from the first conductivity, and an active layer which is provided between the first semiconductor layer and the second semiconductor layer and generates ultraviolet light by electron-hole recombination, with the second semiconductor layer having irregularities on a top surface; and a second ohmic electrode electrically connected to the second semiconductor layer, with the second ohmic electrode including an ohmic contact layer formed on the second semiconductor layer and a reflecting layer formed on the ohmic contact layer, wherein at least a part of the irregularities formed on the top surface of the second semiconductor layer penetrate the ohmic contact layer and come in direct contact with the reflecting layer.

According to another aspect of the present disclosure, there is provided a method for manufacturing a semiconductor light emitting device, the comprising: forming a plurality of semiconductor layers that includes a first semiconductor layer having a first conductivity, a second semiconductor layer having a second conductivity different from the first conductivity, and an active layer which is provided between the first semiconductor layer and the second semiconductor layer and generates ultraviolet light by electron-hole recombination, wherein the plurality of semiconductor layers is made of an AlGaN material, and the second semiconductor layer is a p-type semiconductor layer having irregularities on a top surface thereof and is electrically connected to an ohmic electrode; forming an ohmic contact layer of the ohmic electrode such that at least a part of the irregularities formed on the top surface of the p-type semiconductor layer penetrate the ohmic contact layer; and forming a reflecting layer of the ohmic electrode such the irregularities penetrated the ohmic contact layer come in contact with the reflecting layer.

Effect of the Invention

The advantageous effects of the present disclosure will be described in the latter part of the best mode for carrying out the invention.

DETAILED DESCRIPTION

The present disclosure will now be described in detail with reference to the accompanying drawings.

FIG. 5 shows another exemplary embodiment of a semiconductor light emitting device 100 according to the present disclosure.

Figure 5A:
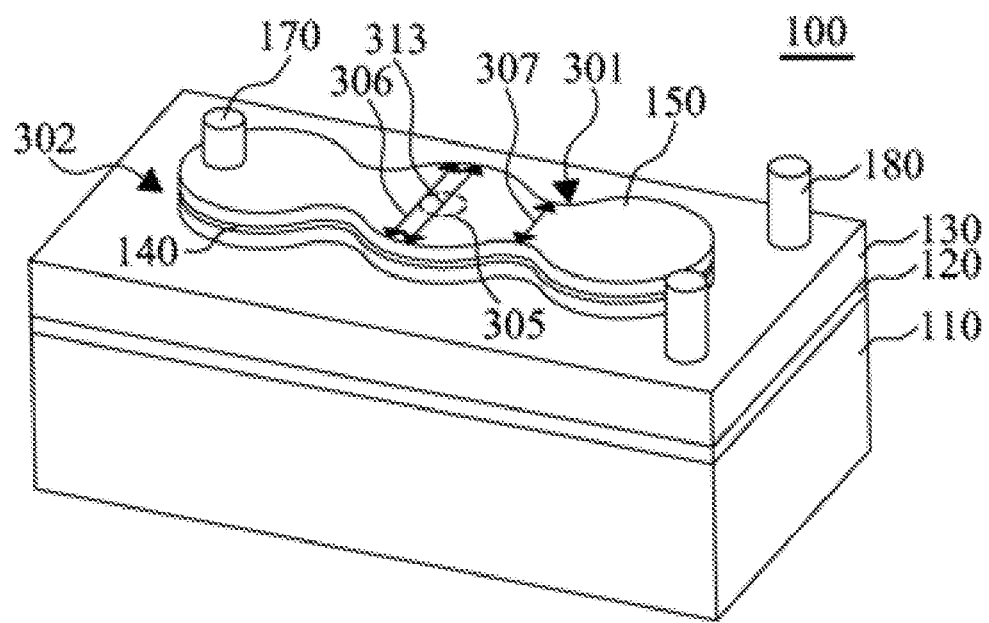
FIG. 5 shows an exemplary embodiment of a semiconductor light emitting device according to the present disclosure.
Figure 5B:
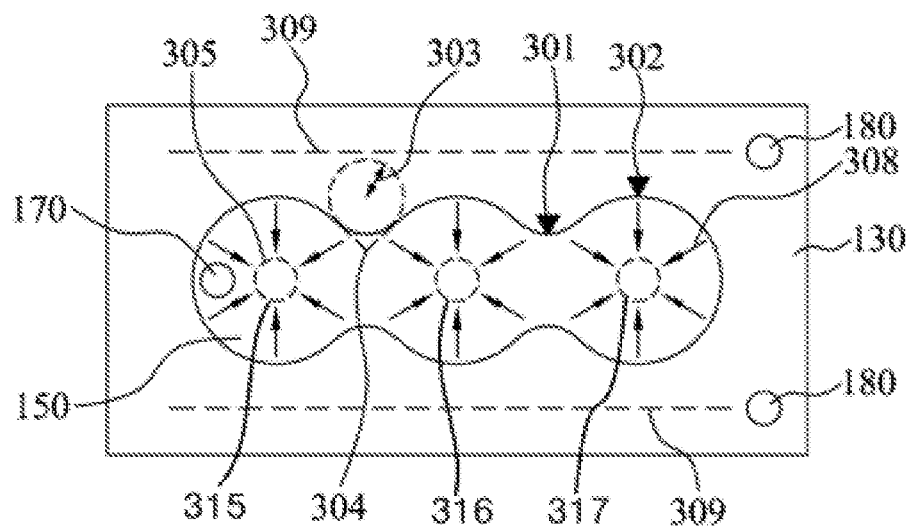
Figure 5C:
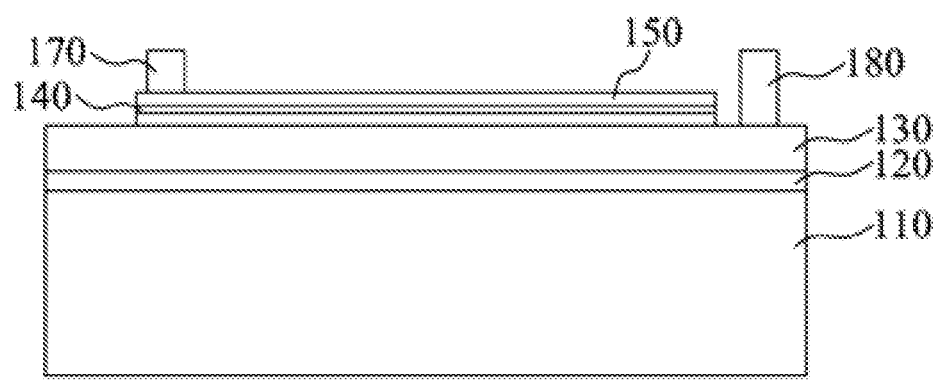

FIGS. 5A to 5C show a perspective view, a plan view, and a side view of the semiconductor light emitting device 100, respectively.

The semiconductor light emitting device 100 includes a substrate 110, a first semiconductor layer 130, an active layer 140, a second semiconductor layer 150, a first electrode 180, and a second electrode 170. The substrate 110 which is eventually removed is mainly a sapphire, SiC, Si, or GaN substrate. Additionally, or alternatively, the substrate 110 may be made of a light transmitting material. The first semiconductor layer 130 is formed on the substrate 110, and a buffer layer 120 may be provided between the first semiconductor layer 130 and the substrate 110.

The first semiconductor layer 130 (e.g. an n-type semiconductor layer) has a first conductivity. The active layer 140 is provided on the first semiconductor layer 130, and the active layer 140 emits ultraviolet light by electron-hole recombination. The second semiconductor layer 150 (e.g. a p-type semiconductor layer) is provided on the active layer 140, and the second semiconductor layer 150 has a second conductivity different from the first conductivity.

The first electrode 180 is formed on the first semiconductor layer 130 and is electrically connected to the first semiconductor layer 130. The second electrode 170 is formed on the second semiconductor layer 150 and is electrically connected to the second semiconductor layer 150.

The first semiconductor layer 130, the active layer 140, and the second semiconductor layer 150 are all based on an AlGaN material, allowing the semiconductor light emitting device 100 to emit ultraviolet light, particularly, ultraviolet light having a shorter wavelength of 300 nm or less (e.g. UV-C in a wavelength range from 200 nm to 280 nm).

As seen from the plan view in FIG. 5B, the first semiconductor 130 surrounds the active layer 140 and the second semiconductor layer 150.

The active layer 140 and the second semiconductor layer 150 at the edge of the semiconductor light emitting device 100 are etched to have the first semiconductor layer 130 exposed broadly. The current spreads along this exposed surface of the first semiconductor layer 130, smoothly flowing to the other side where the second electrode 170 is formed.

While the first semiconductor layer 130 and the substrate 110 transmits most of the ultraviolet light emitted from the active layer 140, the second semiconductor layer 150 absorbs most of the ultraviolet light, causing an increase in the temperature of the semiconductor light emitting device 100. This temperature rise can be limited by partially removing the second semiconductor layer 150.

In view of spreading current, it is preferable that the first electrode 180 is formed extensively on the first semiconductor layer 130. Because the first electrode 180 absorbs the ultraviolet light, however, it is more preferable that the first electrode 180 is formed in dots. Likewise, the second electrode 180 made of the same material as the first electrode 180 is preferably formed in dots.

Referring to the plan view, the boundary defined by the active layer 140 and the second semiconductor layers 150 against the first semiconductor layer 130 is referred to as a perimeter 302 of the active layer 140 and of the second semiconductor layer 150. At least one of junctions 304 along the perimeter 302 is rounded, not angled. This rounded junction 304 may have a radius of curvature 303 between 15 μm and 50 μm. When the junctions 304 along the perimeter 302 are angled (see FIG. 6A), a problem may arise, which will be further described with reference to FIG. 6.

The second semiconductor layer 150 has at least one region 305 at a predefined distance 308 away from the perimeter 305. The ultraviolet light emitted from the active layer 140 cannot reach these regions 305 beyond the predefined distance 308. Its cause will be explained below with reference to FIG. 6. Although it appears that the regions 305 without ultraviolet emission are on the second semiconductor layer 150, they might not be present on the second semiconductor layer 150 because the second semiconductor layer 150 absorbs the ultraviolet light. The regions 305 without ultraviolet emission can be found on the side of the first semiconductor layer 130 or the substrate 110, through which the ultraviolet light leaves (this is shown on the side of the second semiconductor layer 150).

As mentioned above, one or more regions 305 are provided, and there is a passage 301 between the regions 305 that has a width 307 smaller than minimum width 306 of the perimeter 302, passing by the regions 305.

The regions 305 include a first region 315, a second region 316, and a third region 317, for example. A passage 301 is present between the first region 315 and the second region 316, and between the second region 316 and the third region 317. The presence of the passage 301 contributes to area reduction of the regions 305 without ultraviolet emission.

The regions 305 are formed in locations where the perimeter 302 has maximum width 313.

FIG. 6 shows another exemplary embodiment of a semiconductor light emitting device according to the present disclosure.

Figure 6A:
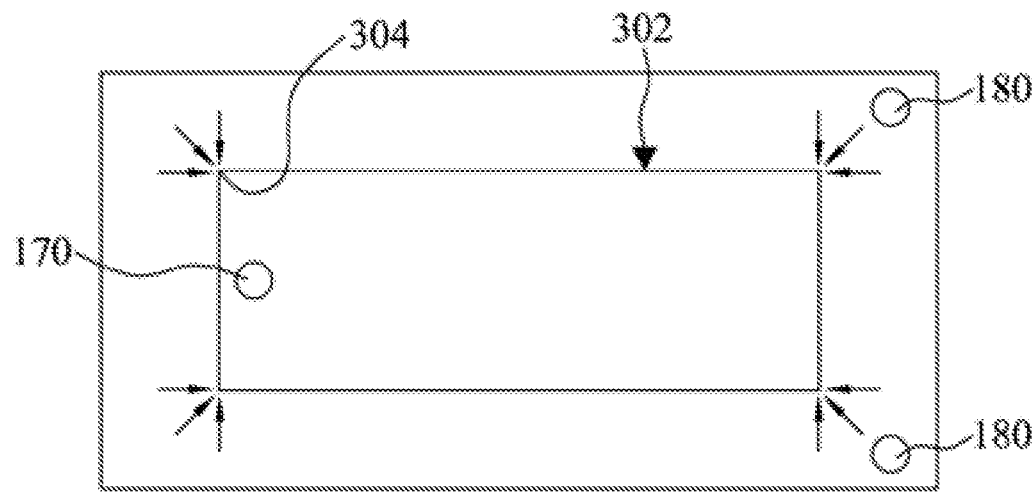
FIG. 6 shows another exemplary embodiment of a semiconductor light emitting device according to the present disclosure.

FIG. 6A illustrates angled junctions 304 along the perimeter 304. As the current is collected at these angled junctions 304, portions of the semiconductor layer having such angled junctions 304 can be damaged.

Figure 6B:
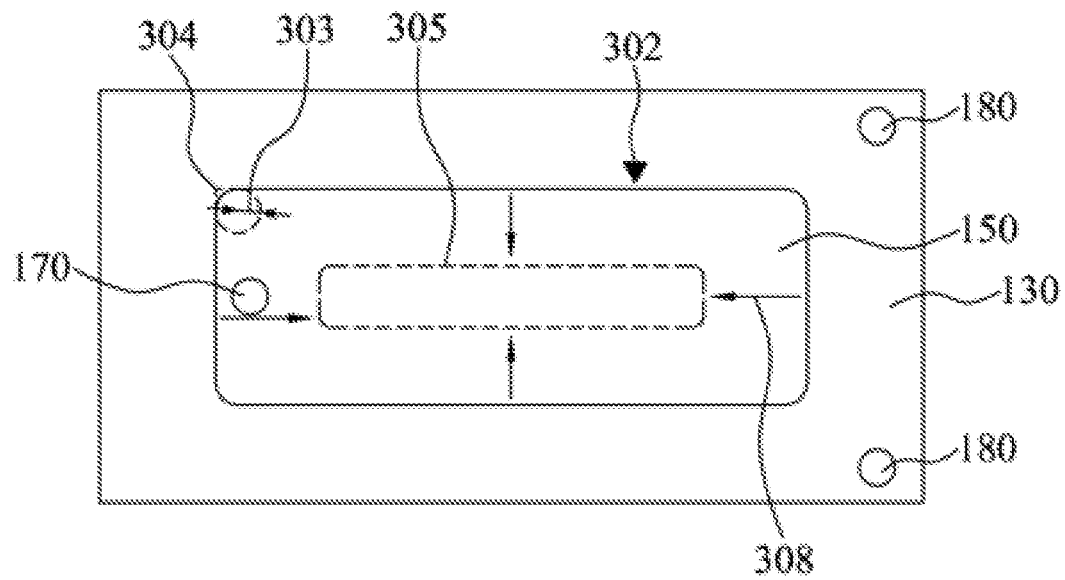

Therefore, the junctions 304 are preferably rounded along the perimeter 302, as shown in FIG. 6B. With this non-angular perimeter 302, it is possible to mitigate damages to the semiconductor layer due to the current.

However, the current spreads evenly only within a predefined distance 308 from the perimeter 302, and it cannot reach further. In other words, there are regions 305 at the predefined distance away from the perimeter 302, where no current spreading is available and thus, no ultraviolet emission occurs.

Figure 7:
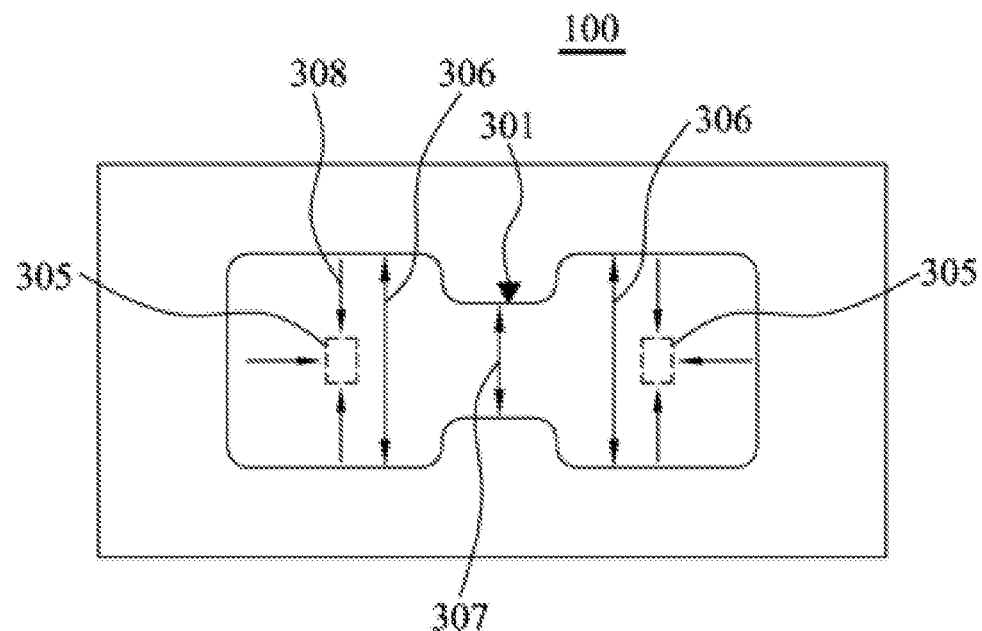
FIG. 7 shows another exemplary embodiment of a semiconductor light emitting device according to the present disclosure.

FIG. 7 shows another exemplary embodiment of a semiconductor light emitting device according to the present disclosure.

In order to increase the size of the active layer 140 (see FIG. 5) while reducing the size of each region 305 without ultraviolet emission, a passage 301 having a width 307 smaller than minimum width 306 of the region 305 is formed between the regions 305. The width 307 of the passage 301 is preferably less than twice the distance 308 from the perimeter 302 to the region 305 without ultraviolet emission.

As the light is emitted in all direction, these smaller regions 305 may be obscured by the light.

Figure 8:
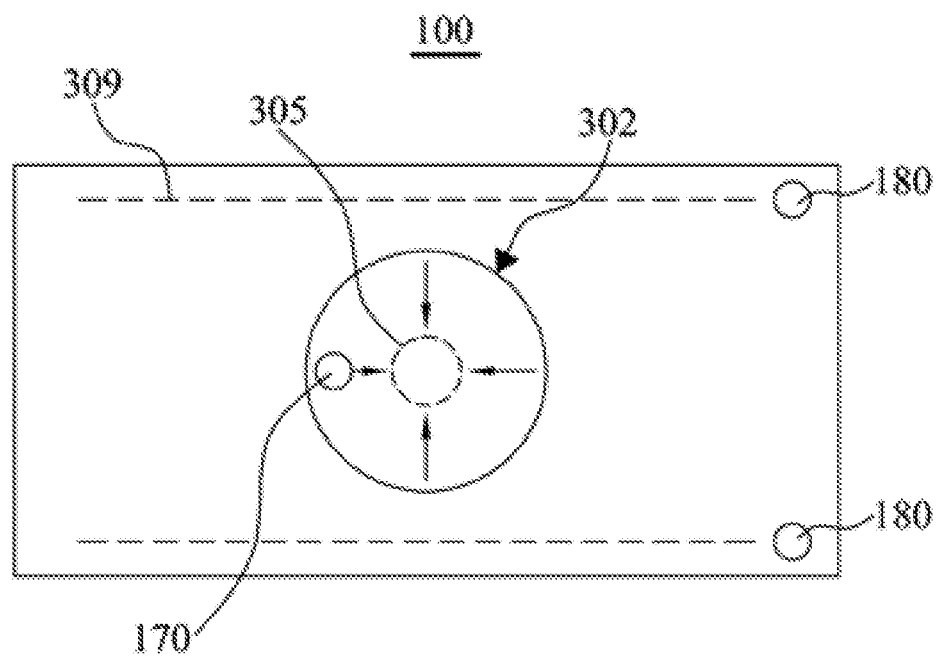
FIG. 8 shows another exemplary embodiment of a semiconductor light emitting device according to the present disclosure.

FIG. 8 shows another exemplary embodiment of a semiconductor light emitting device according to the present disclosure.

Here, the perimeter 302 has a circular shape in order to avoid angled junctions 304 (see FIG. 6). With this circular perimeter 302, however, a large portion of the active layer 140 (see FIG. 5) could be removed in the longitudinal direction, lowering the light emission efficiency, even if the semiconductor light emitting device 100 may be configured as large as possible in the width direction. This problem can be resolved with a structure shown in FIG. 9 (to be explained).

An extension line 309, which stretches out in the longitudinal direction of the light emitting device 100 from at least one of the first electrode 180 and the second electrode 170, should not overlap with the perimeter 302. This is because when electrons and/or holes coming out of the first electrode 180 run into the perimeter 302, for example, they would not spread all over an exposed portion of the first semiconductor layer 130, but migrate to the second electrode 170, causing only a part of the active layer 140 to be activated.

Figure 9:
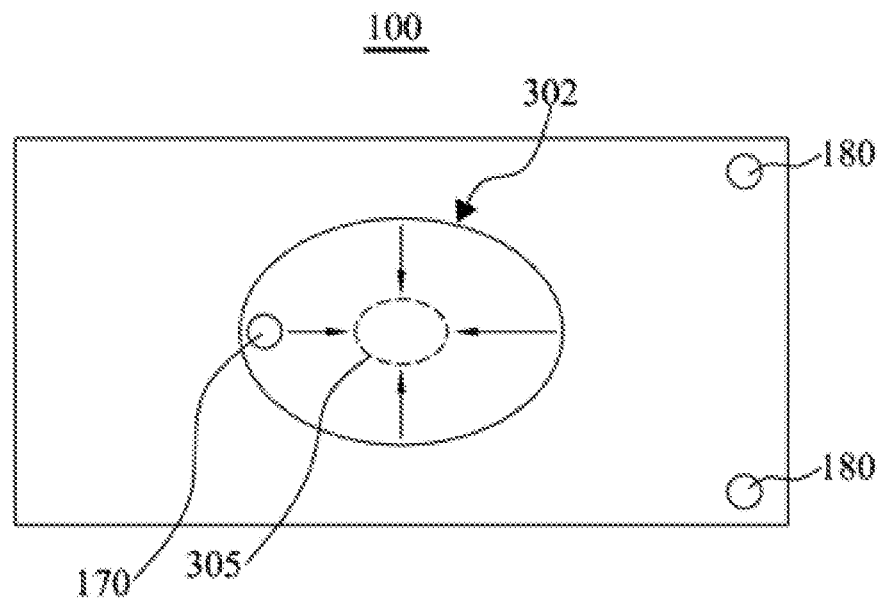
FIG. 9 shows another exemplary embodiment of a semiconductor light emitting device according to the present disclosure.

FIG. 9 shows another exemplary embodiment of a semiconductor light emitting device according to the present disclosure.

Here, the perimeter 302 of the semiconductor light emitting device 100 has an elliptical shape (i.e., no angled edges) with an increased length, as compared with the circular perimeter 302 of the semiconductor light emitting device 100 of FIG. 8. As a result, a wider active layer 140 (see FIG. 5) than one in FIG. 8 may be obtained. With this larger active layer 140, a total amount of the ultraviolet light emitted from the active layer 140 is increased. However, the region 305 without ultraviolet emission in the center of the ellipse can also become smaller in size as the active layer 140 gets larger.

Figure 10:
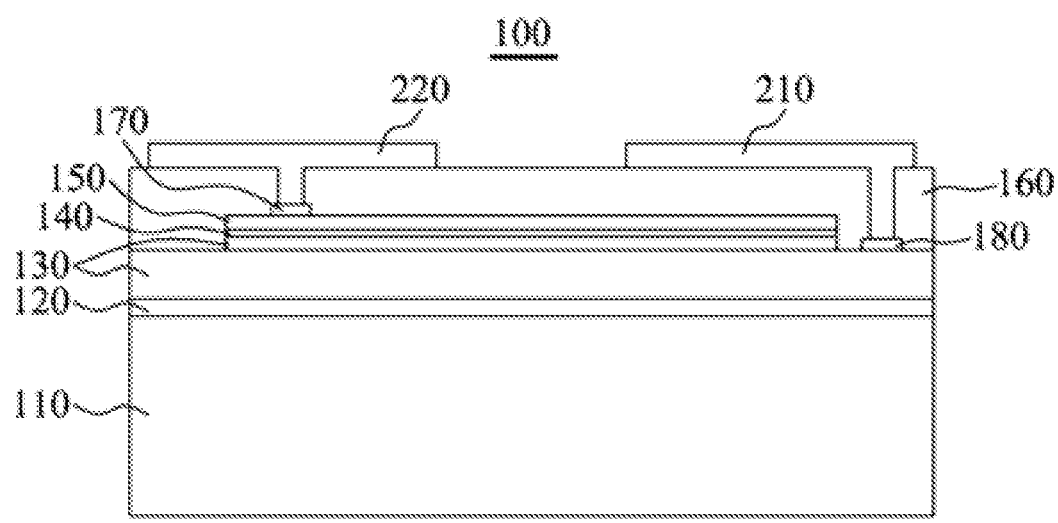
FIG. 10 shows another exemplary embodiment of a semiconductor light emitting device according to the present disclosure.

FIG. 10 shows another exemplary embodiment of a semiconductor light emitting device 100 according to the present disclosure.

In particular, FIG. 10 is a cross-sectional view of the semiconductor light emitting device 100.

The semiconductor light emitting device 100 further includes an insulating layer 160, a first pad electrode 210, and a second pad electrode 220.

The insulating layer 160 is formed on the first semiconductor layer 130, the second semiconductor layer 150, and the active layer 140. It transmits light and is made of a non-conducting material, such as $SiO_2$.

The first pad electrode 210 and the second pad electrode 220 are formed on the insulating layer 160. At least a portion of the first pad electrode 210 is electrically connected to the first electrode 180. At least a portion of the second pad electrode 220 is electrically connected to the second electrode 170.

The first pad electrode 210 and the second pad electrode 220 are arranged to provide a stable contact with an external power supply. In particular, broader first pad electrode 210 and the second pad electrode 220 are preferably formed extensively to ensure a stable contact with the external power supply.

The first pad electrode 210 and the second pad electrode 220 cover the insulating layer 160. However, because the ultraviolet light has a shorter wavelength, most of the ultraviolet light is absorbed by the first pad electrode 210 and the second pad electrode 220.

The perimeter 302 may be formed at right angles with the first semiconductor layer 130. The ultraviolet light coming out of a lateral surface of the active layer 140 goes out through a lateral surface of the semiconductor light emitting device 100.

Figure 11A:
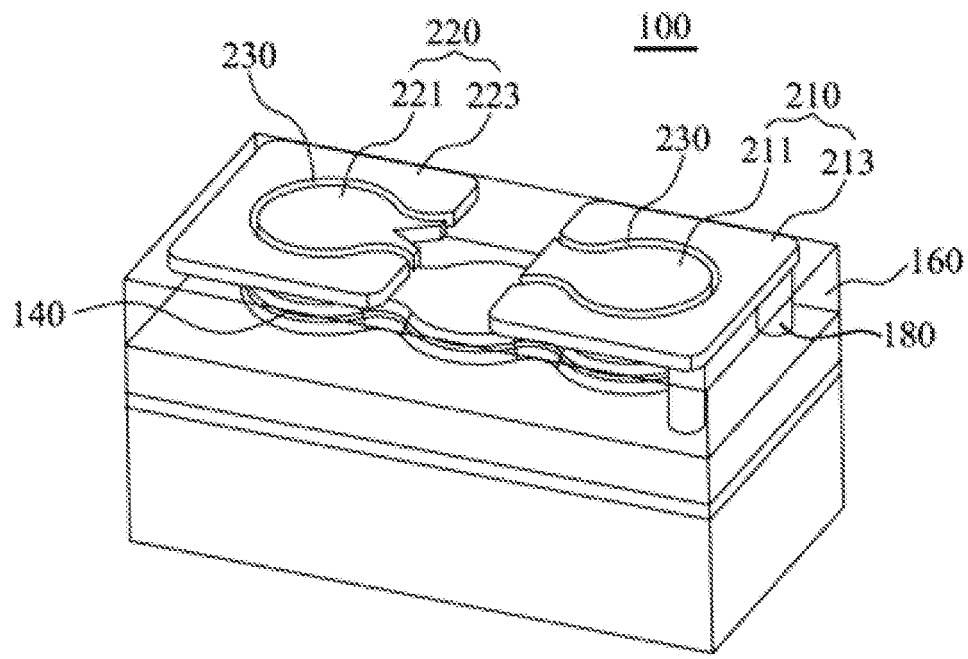
FIG. 11 shows another exemplary embodiment of a semiconductor light emitting device according to the present disclosure.
Figure 11B:
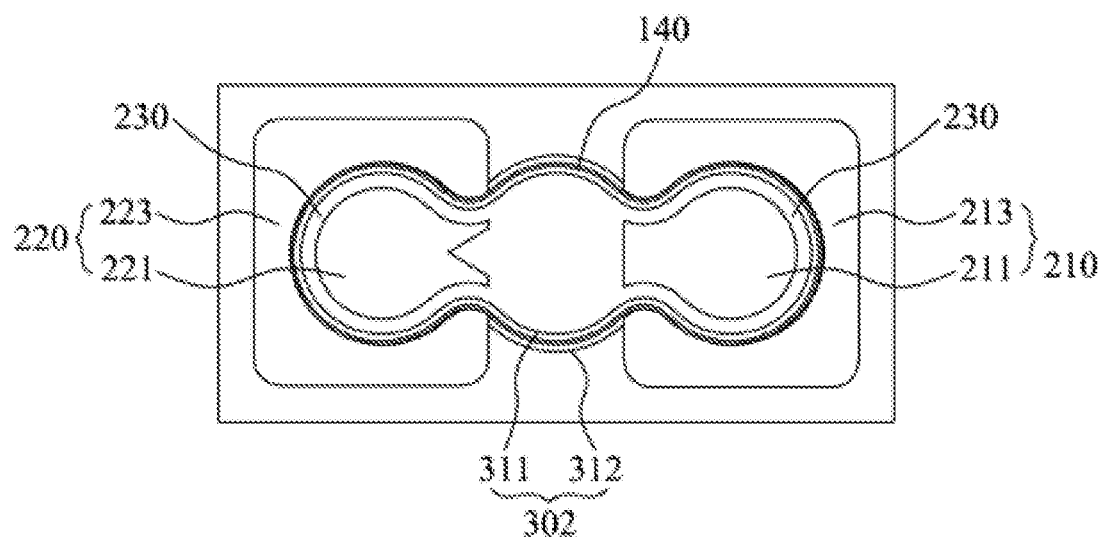
Figure 11C:
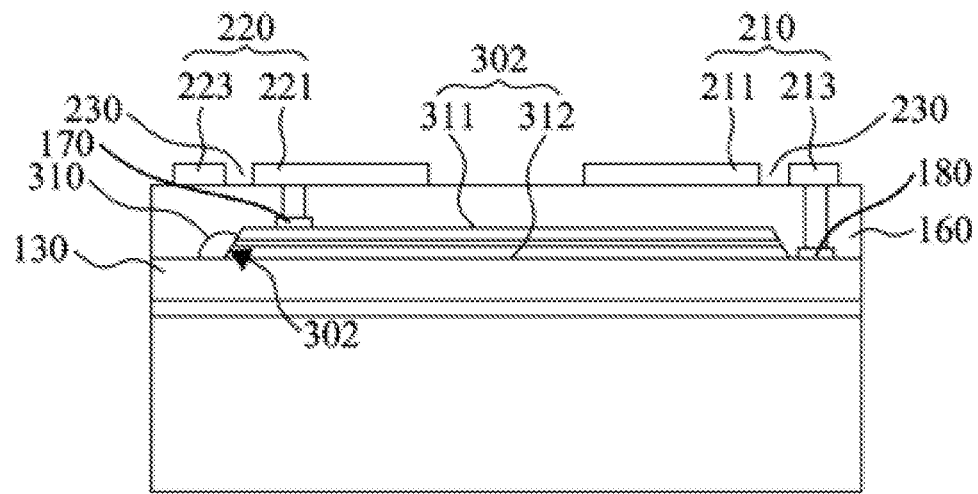

FIG. 11 shows another exemplary embodiment of a semiconductor light emitting device according to the present disclosure.

Here, at least one of the first pad electrode 210 and the second pad electrode 220 includes an exposed part 230 exposing the insulating layer 160, such that most of the ultraviolet light would not be absorbed by the first pad electrode 210 and the second pad electrode 220 as in FIG. 10. The perimeter 302 may be overlapped with the exposed part 230. If seen in plan view, the exposed part 230 is formed along the lateral surface of the active layer 140. This will be further described below with reference to FIG. 12.

In order to direct the ultraviolet light coming out from the lateral surface of the active layer 140 to the front surface, instead of the lateral surface, of the semiconductor light emitting device 100, the exposed top surface of the first semiconductor layer 130 and the lateral surface of the active layer 140 are arranged at an obtuse angle. If the angle between the exposed top surface of the first semiconductor layer 130 and the lateral surface of the active layer 140 is greater than 90 degrees, a larger portion of the active layer 140 can be available for emitting the light, as compared with the case where the angle is 90 degrees. Accordingly, more light can be forwarded to the second semiconductor layer 150.

A perimeter 302 is defined along the active layer 140 and the second semiconductor layer 150, which is the boundary between the active layer 140 and the first and second semiconductor layers 130, 150. When the exposed top surface of the first semiconductor layer 130 forms an obtuse angle with the lateral surface of the active layer 140, a first perimeter 311 and a second perimeter 312 are formed, as shown in a plan view in FIG. 11B. With the active layer 140 being inclined at an angle greater than 90 degrees, the first perimeter 311 is defined by the boundary between the top surface of the second semiconductor layer 150 and the active layer 140, and the second perimeter 312 is defined by the boundary between the top surface of the first semiconductor layer 130 and at least one of a non-etched portion of the first semiconductor layer 130 and the active layer 140. If seen in plan view, a region between the first perimeter 311 and the second perimeter 312 is at least partially overlapped with the exposed part 230. Preferably, the active layer 140 is provided between the first perimeter 311 and the second perimeter 312 and is at least partially overlapped with the exposed part 230.

As the top surface of the first semiconductor layer 130 and the lateral surface of the active layer 140 are arranged at an obtuse angle, the top surface of the second semiconductor layer 150 may have a smaller area than the active layer 140.

The first pad electrode 210 includes a first external electrode 213 and a first internal electrode 211 separated by the exposed part 230. Also, the second pad electrode includes a second external electrode 223 and a second internal electrode 221 by the exposed part 230. The first external electrode 213 is electrically connected to the first electrode 180, while the first internal electrode 211 is not electrically connected. The second internal electrode 221 is electrically connected to the second electrode 170, while the second external electrode 223 is not electrically connected.

The first internal electrode 211 and the second external electrode 223, which are not electrically connected, can structurally help external bonding to increase bonding strength. Additionally, the first internal electrode 211 and the second external electrode 223 can be formed at an even height with the first external electrode 213 and the second internal electrode 221. If not, the semiconductor light emitting device 100 could be slanted when mounted.

Figure 12:
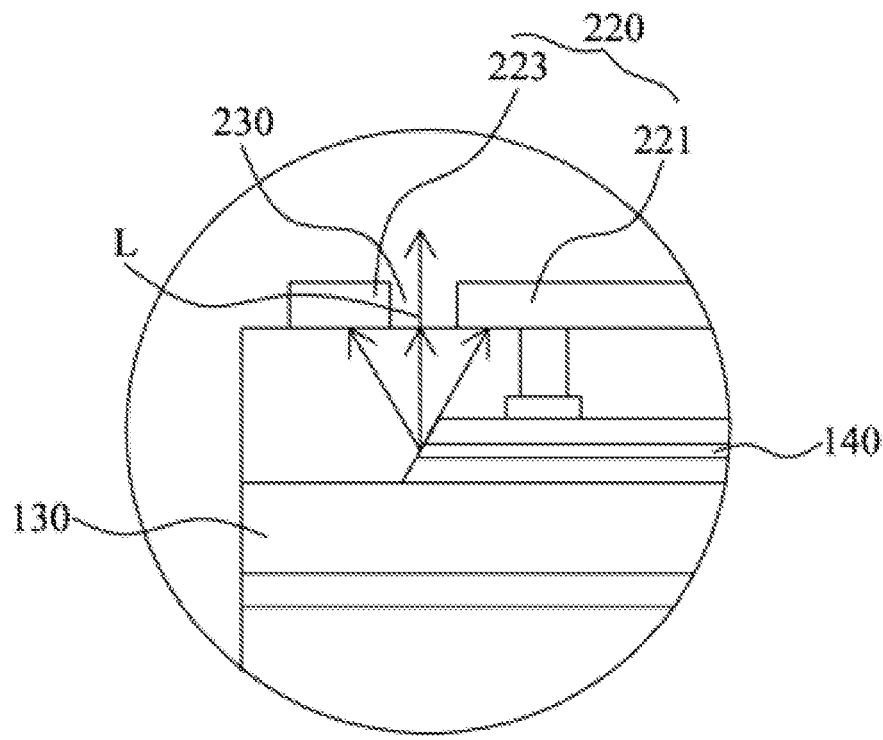
FIG. 12 shows another exemplary embodiment of a semiconductor light emitting device according to the present disclosure.

FIG. 12 illustrates light emission through the exposed part of the semiconductor light emitting device according to the present disclosure.

The light emission efficiency can be increased by causing ultraviolet light L to partly escape through the exposed part 230 out of the semiconductor light emitting device 100, instead of being absorbed by the second pad electrode 220. This is achieved because the ultraviolet light L emitted through the exposed part 230 can be reflected by an external substrate (not shown) on which the semiconductor light emitting device 100 is mounted and then forwarded to the substrate 110 of the semiconductor light emitting device 100. The same concept can be applied to the first pad electrode 210, although not shown in FIG. 12.

As such, the semiconductor light emitting device 100 of FIG. 11 has a higher light emission efficiency than that of the semiconductor light emitting device 100 of FIG. 10.

FIG. 13 shows another exemplary embodiment of a semiconductor light emitting device 100 according to the present disclosure.

Figure 13A:
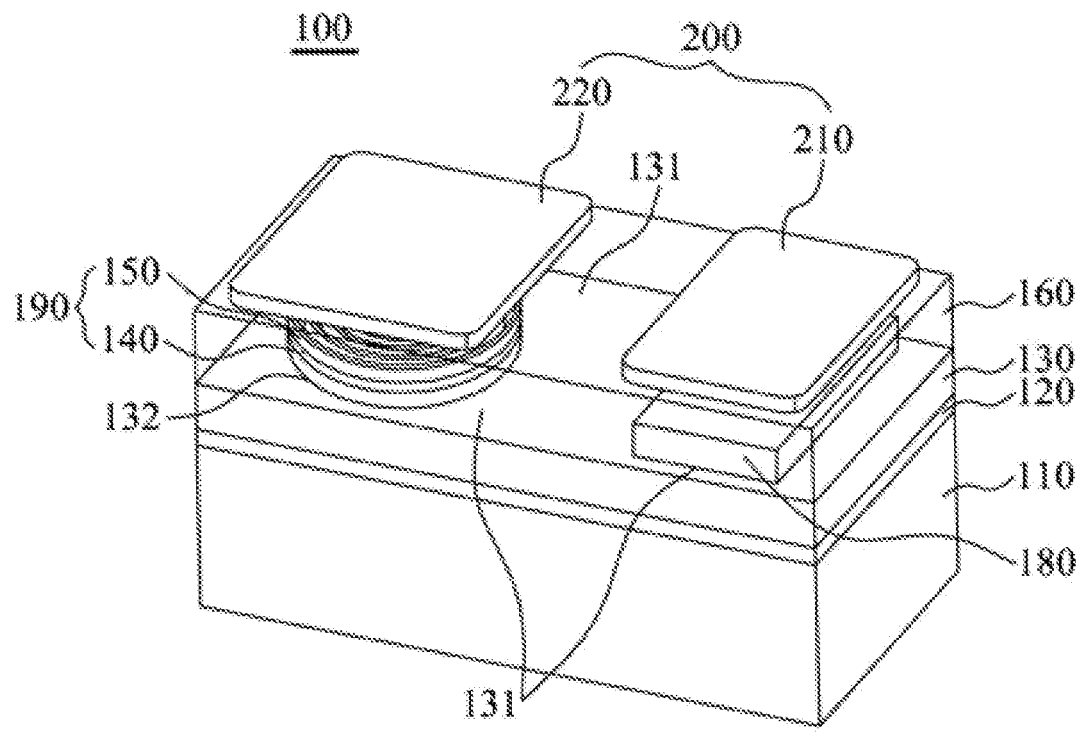
FIG. 13 shows another exemplary embodiment of a semiconductor light emitting device according to the present disclosure.
Figure 13B:
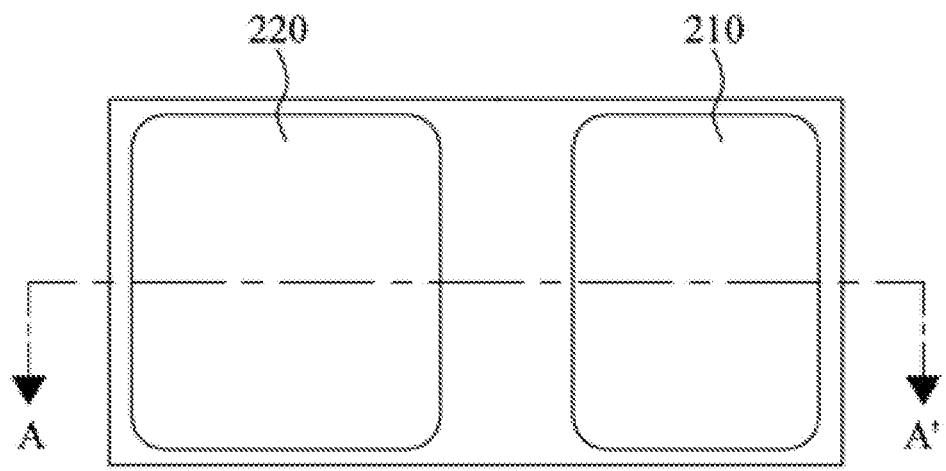
Figure 13C:
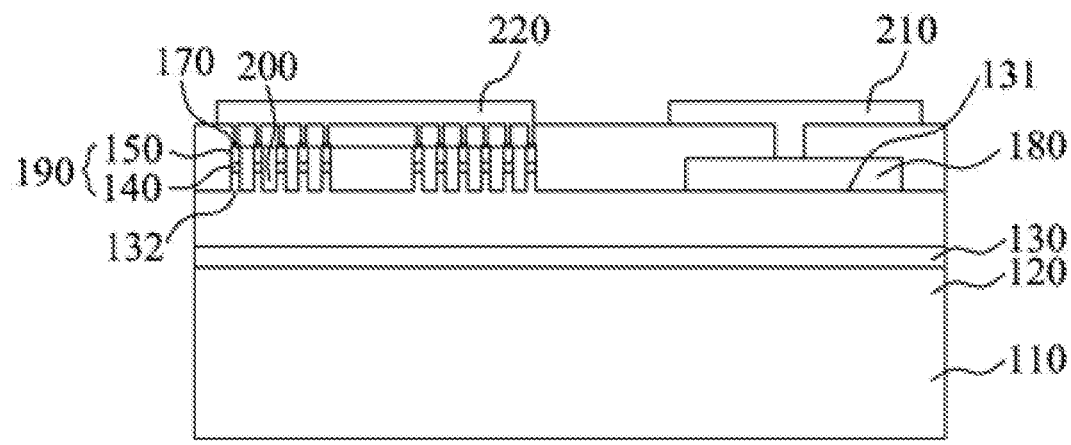

FIG. 13A is a perspective view of the semiconductor light emitting device 100, FIG. 13B is a plan view of FIG. 13A, and FIG. 13C is a cross-sectional view taken along line AA' of FIG. 13B.

The semiconductor light emitting device 100 includes a substrate 110, a first semiconductor layer 130, an active layer 140, a second semiconductor layer 150, a first electrode 180, a second electrode 170, a plurality of protruded parts 190, an insulating layer 160, a first pad electrode 210, a second pad electrode 220, a first electrical connection 211, and second electrical connection 221.

The first electrode 180 is formed on the first semiconductor layer 130 and is electrically connected to the first semiconductor layer 130. The second electrode 170 is formed on the second semiconductor layer 150 and is electrically connected to the second semiconductor layer 150.

The plurality of protruded parts 190 protrude from the first semiconductor layer 130. The active layer 140 and the second semiconductor layer 150 may be included in the protruded parts 190. Additionally, the first semiconductor layer 130 may be included in the protruded parts 190.

A recess 200 is formed between the protruded parts 190. The recess 200 refers to a space between the protruded parts 190.

If seen in plan view, the protruded parts 190 are surrounded by the first semiconductor layer 130. Similar to FIG. 6, the protruded parts 190 in this embodiment are preferably non-angular because the current can be collected at those angular protruded parts, causing damages to the semiconductor layers.

The protruded parts 190 may have a spiral shape. Although not shown, the exposed top surface of the first semiconductor layer 130 may form an obtuse angle 310 (see FIG. 11) with the lateral surface of the active layer 140, as in FIG. 11.

The insulating layer 160 is provided on the first semiconductor layer 130, the active layer 140 and the second semiconductor layer 150, and between the first pad electrode 210 and the second pad electrode 220, and between the first semiconductor layer 130 and the second semiconductor layer 150. The insulating layer 160 transmits light and is made of a non-conducting material, such as $SiO_2$.

The first pad electrode 210 and the second pad electrode 220 are provided, covering the insulating layer 160. The first pad electrode 210 and the second pad electrode 220 can be made of a conducting material.

The first electrical connection 211 is provided between the first pad electrode 210 and the first semiconductor layer 130, in order to electrically connect the first pad electrode 210 and the first semiconductor layer 130.

The second electrical connection 221 is provided between the second pad electrode 220 and the second semiconductor layer 150, in order to electrically connect the second pad electrode 220 and the second semiconductor layer 150.

The first semiconductor layer 130 includes a first region 131 and a second region 132. The second region 132 is where the protruded parts 190 and the recesses 200 are provided. The first region 131 and the second region 132 together constitute the first semiconductor layer 130, and the first electrode 180 may be provided in a portion of the first region 131. Preferably, the first region 131 is formed equal to or broader than the second region 132.

For current spreading or current distribution, a conventional semiconductor light emitting device in the art had the first electrode 170 formed extensively across the first region 131 and the second region 132, or the first electrode 170 formed on a portion of the first semiconductor layer 130 around the second semiconductor layer 150, promoting uniform current spreading between the first semiconductor layer 130 and the second semiconductor layer 150. However, the semiconductor ultraviolet light emitting device 100 according to the present disclosure not only emits light directed toward the substrate 110 from the active layer 140, but it also emits ultraviolet light at the same time. Knowing that the ultraviolet light is well absorbed by a metallic material, if the first electrode 170 is formed extensively across the first semiconductor layer 130 as in the conventional semiconductor light emitting device in the art, most of the ultraviolet light will be absorbed by the first electrode, lowering the efficiency of light emission. Therefore, in the present disclosure, instead of having the first electrode 170 formed extensively, the first region 131 has a broader area for current spreading. In particular, it is preferable that the first region 131 on the first semiconductor layer 130 is broader than the second region 132, and the second region 132 surrounding the protruded parts 190 is formed at least at a predefined distance away from the perimeter of the first semiconductor layer 130. The second region 132 is preferably at least 30 µm away from the perimeter of the first semiconductor layer 130, which is more favorable for current spreading.

Except for the features described above in this embodiment, the semiconductor light emitting device 100 in FIG. 13 is substantially same as the semiconductor light emitting device 100 in FIG. 5.

While a detailed view of the spiral-shaped protruded part 190 was available in FIG. 13, the rest of the drawings starting FIG. 14 will provide a more simplified view of the spiral-shaped protruded part 190.

FIG. 14 shows another exemplary embodiment of a semiconductor light emitting device 100 according to the present disclosure.

The semiconductor light emitting device 100 in this embodiment does not have the insulating layer 160, the first pad electrode 210, the second pad electrode 220, the first electrical connection 211 and the second electrical connection 221, different from the semiconductor light emitting device shown in FIG. 13.

Referring back to FIG. 14, the semiconductor light emitting device 100 includes a substrate 110, a first semiconductor layer 130, an active layer 140, and a second semiconductor layer 150. Among the first semiconductor layer 130, the active layer 140 and the second semiconductor layer 150, at least the active layer 140 and the second semiconductor layer 150 are etched to form protruded parts 190. Optionally, or additionally, the first semiconductor layer 130 may partly be etched as shown in FIG. 14. The first electrode 180 is formed on the first semiconductor layer 130, and the second electrode 170 is formed on the second semiconductor layer 150.

Figure 14A:
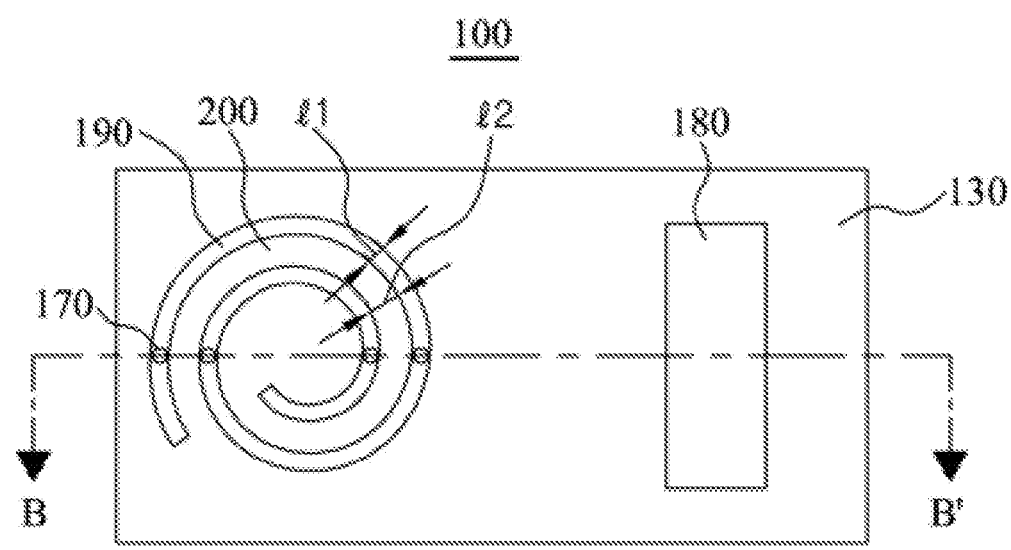
FIG. 14 shows another exemplary embodiment of a semiconductor light emitting device according to the present disclosure.
Figure 14B:
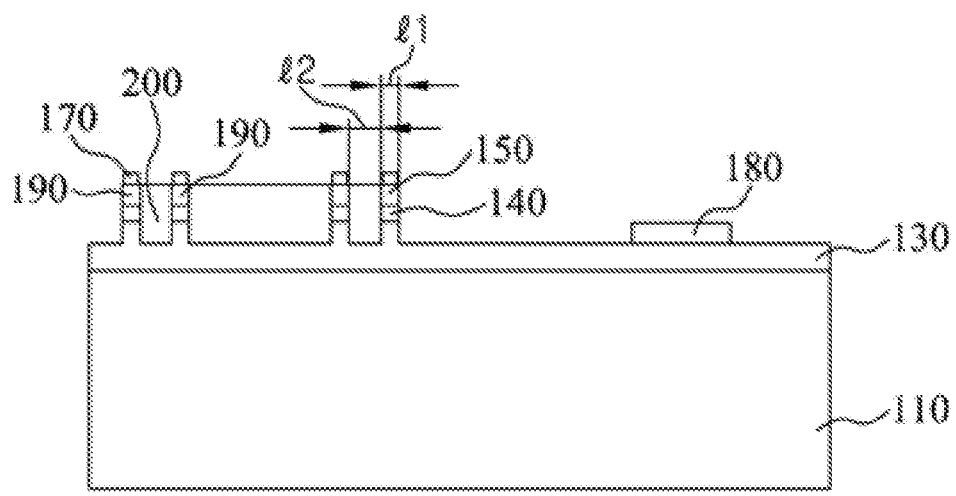

FIG. 14A is a plan view of the semiconductor light emitting device 100, and FIG. 14B is a cross-sectional view of FIG. 14A.

As seen from the plan view, the first semiconductor 130 of the semiconductor light emitting device 100 surrounds a plurality of protruded parts 190. The second semiconductor layer 150 included in the protruded parts 190 of a spiral shape has a width $\ell 1$, and the first semiconductor layer 130 between the second semiconductor layers 150 has a width $\ell 2$ (i.e., a width of a recess 200), as shown in the drawing. Preferably, the width $\ell 1$ of the protruded parts 190 should be minimal such that the second region 132 (see FIG. 13) can accommodate as many protruded parts 190 as possible. With such a minimal width $\ell 1$ of the protruded parts 190, the active layer 140 emitting light in the second region 132 (see FIG. 13) can be maximized. Hence, the width $\ell 1$ of the second semiconductor layer 150 of the protruded parts 190 is preferably no greater than the width $\ell 2$ of the first semiconductor layer 150.

FIGS. 15 to 16 show an exemplary embodiment of a method for manufacturing a semiconductor light emitting device according to the present disclosure.

Figure 15A:
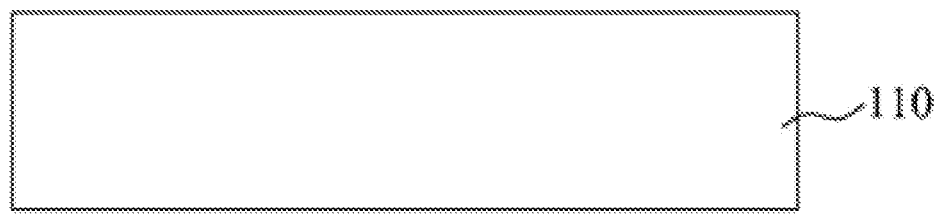
FIGS. 15 and 16 show an exemplary embodiment of a method for manufacturing a semiconductor light emitting device according to the present disclosure.

A substrate 110 is prepared as shown in FIG. 15A.

Figure 15B:
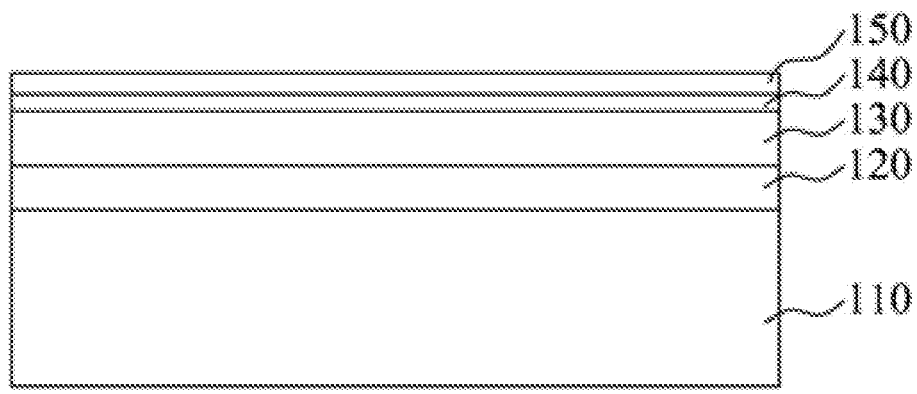

Next, as shown in FIG. 15B, a buffer layer 120 may be formed on the substrate 110, and a plurality of semiconductor layers 130, 140, 150 may be provided on the buffer layer 120. Optionally, the buffer layer 120 can be omitted, such that the plurality of the semiconductor layers 130, 140, 150 may be placed directly on the substrate 110. The semiconductor layers may include a first semiconductor layer 130, an active layer 140, and a second semiconductor layer 150, which are stacked in the order mentioned.

Figure 15C:
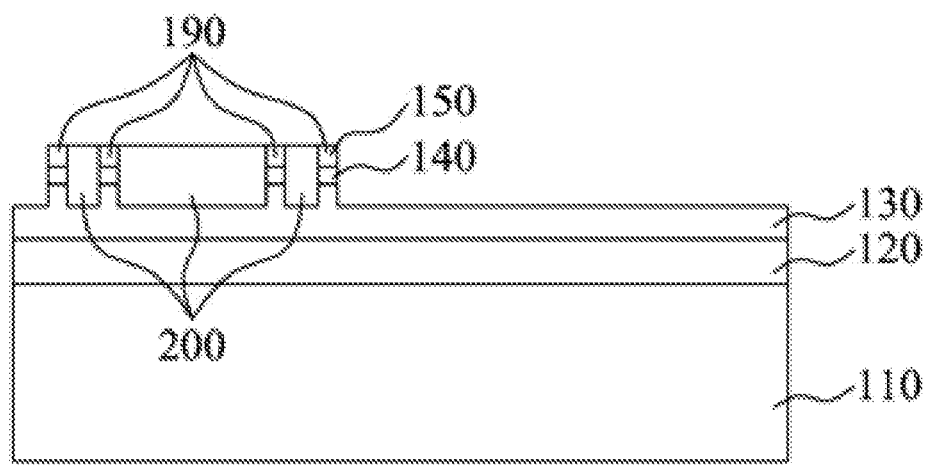

The semiconductor layers 130, 140, 150 are then etched to form protruded parts 190, which are protruded from the first semiconductor layer 130 as shown in FIG. 15C. These protruded parts 190 may include the second semiconductor layer 150 and the active layer 140. Optionally, the first semiconductor layer 130 may further be included in the protruded parts 190. Recesses 200 are defined between the protruded parts 190.

Figure 15D:
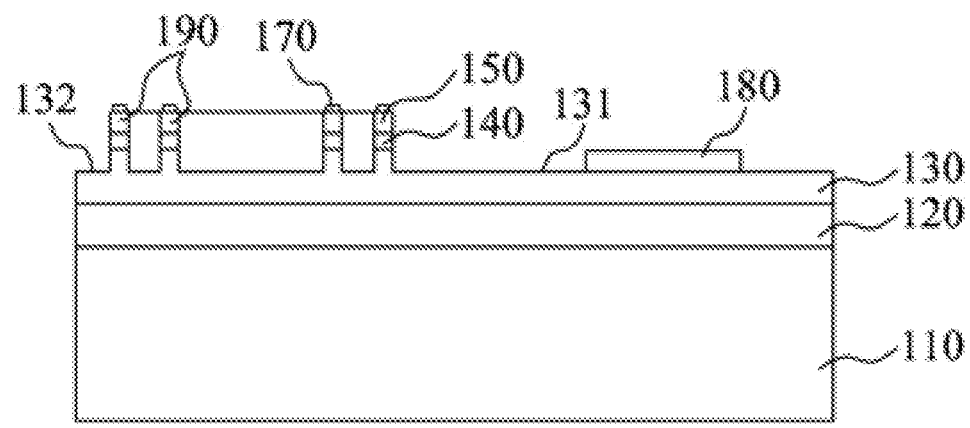

Referring now to FIG. 15D, the first semiconductor layer 130 is divided into a first region 131 without protruded parts and a second region 190 with those protruded parts 190. A second electrode 170 is provided on the second semiconductor layer 150, and a first electrode 180 is provided in the first region 131.

Figure 16A:
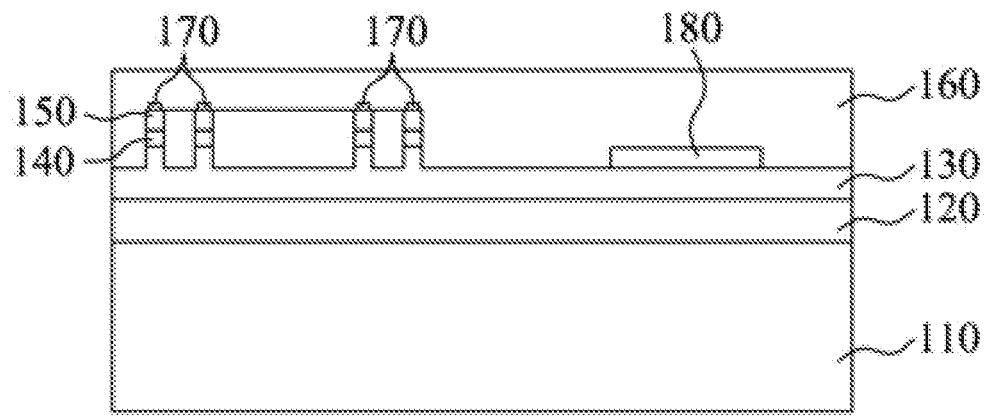

Next, an insulating layer 160 is provided on the semiconductor layers 130, 140, 150, the first electrode 180, and the second electrode 170, as shown in FIG. 16A.

Figure 16B:
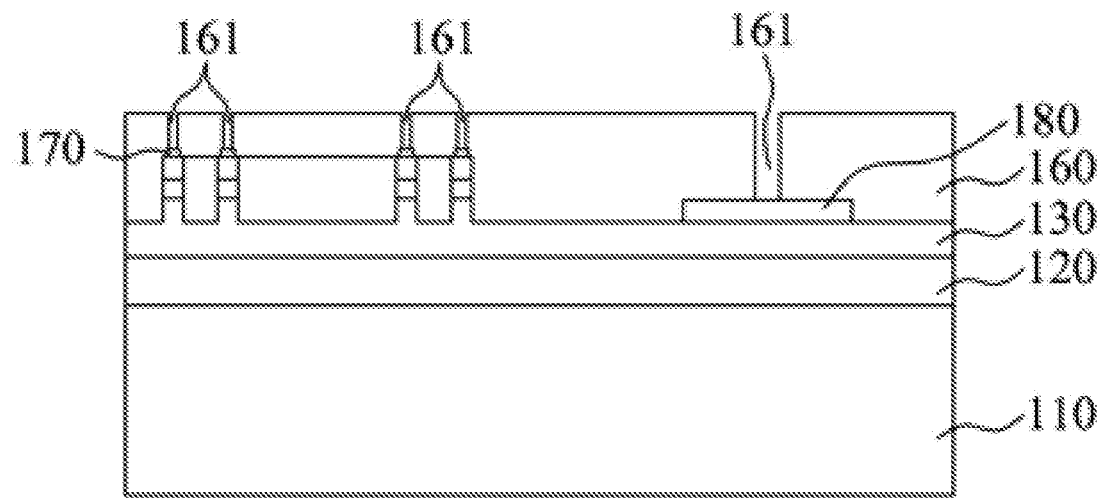

A portion of the insulating layer 160 on the first electrode 180 and the second electrode 170 has a plurality of penetrated parts 161 running through the insulating layer 160, as shown in FIG. 16B. These penetrated parts 161 may be obtained by etching.

Figure 16C:
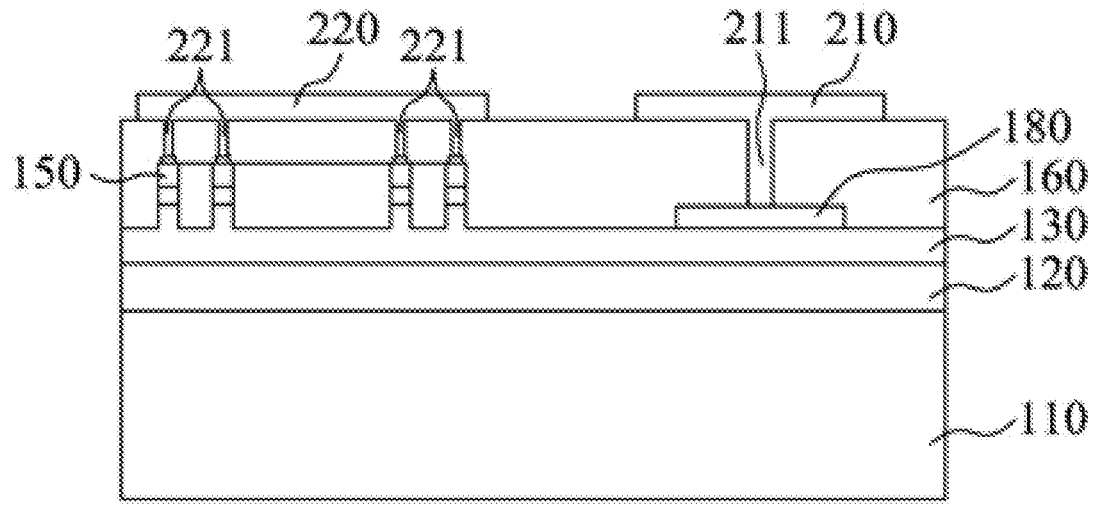

A first electrical connection 211 for connection to the first semiconductor layer 130 is positioned its corresponding penetrated part 161 (see FIG. 16A), as shown in FIG. 16C. Similarly, a second electrical connection 221 for connection to the second semiconductor layer 150 is positioned in its corresponding penetrated part 161. The first electrical connection 211 may be electrically connected to both the first electrode 180 and a first pad electrode 210, and the second electrical connection 221 may be electrically connected to both the second electrode 170 and a second pad electrode 220.

FIG. 17 shows other exemplary embodiments of a semiconductor light emitting device 100 according to the present disclosure.

Figure 17A:
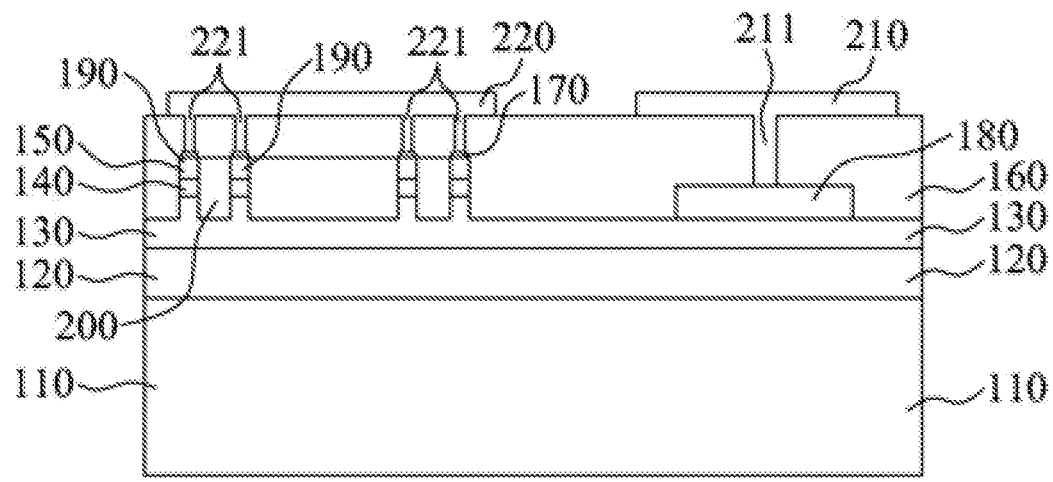
FIG. 17 shows other exemplary embodiments of a semiconductor light emitting device according to the present disclosure.
Figure 17B:
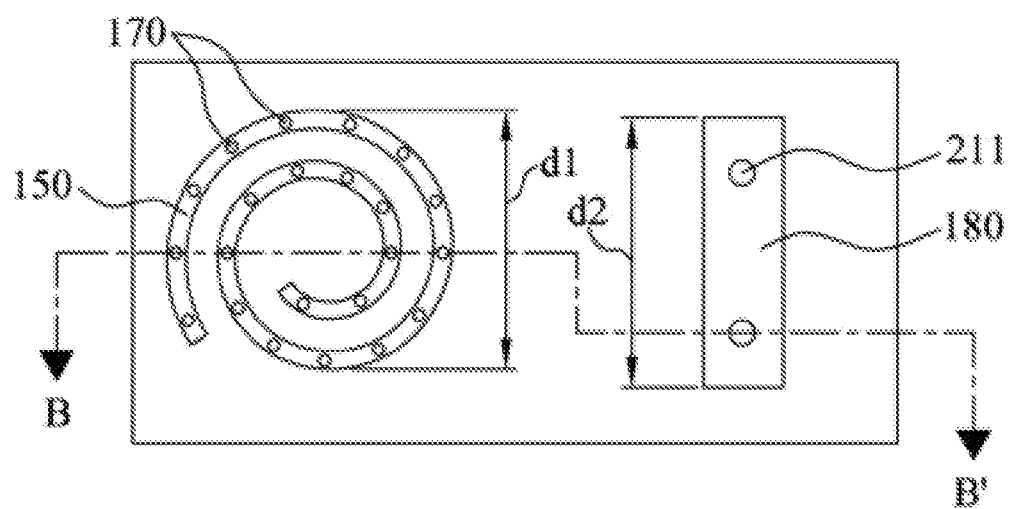
Figure 17C:
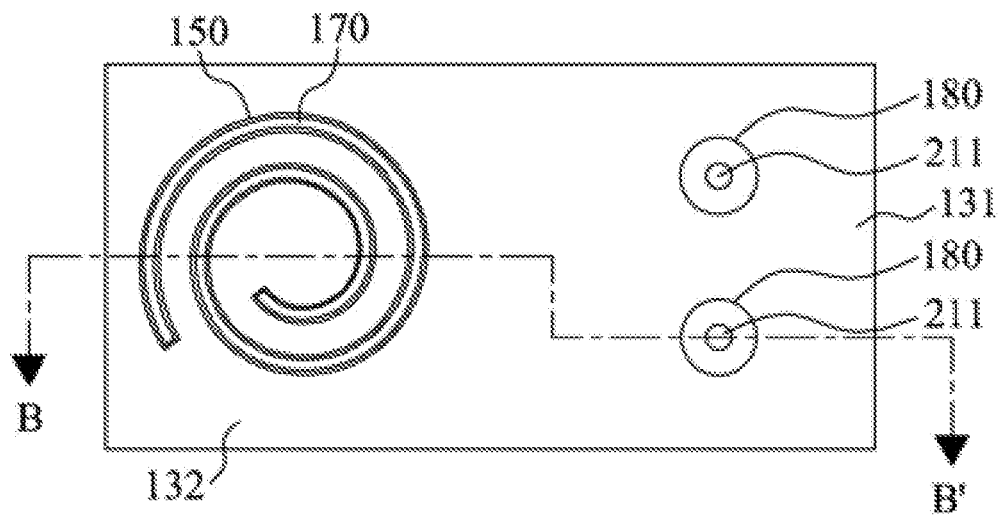

FIG. 17A is a cross-sectional view of the semiconductor light emitting device 100, taken along line BB" of FIG. 17B and FIG. 17C. A first pad electrode 210 and a second pad electrode 220 omitted in FIG. 17A are shown in more detail in FIG. 18.

A first electrode 180 and a second electrode 170 may be ohmic electrodes. In general, the ohmic electrode may be formed in contact with a semiconductor layer. For example, the ohmic electrode may be provided to facilitate supplying power to the first semiconductor layer 130 and the second semiconductor layer 150.

FIG. 17B illustrates a plurality of second electrodes 170 formed on the second semiconductor layer 150. The second electrodes 170 form dots along the second semiconductor layer 150. A second electrical connection 221 is provided for connection to the second electrode 170. Similarly, a first electrical connection 211 is provided for connection to the first electrode 180 of a tetragonal shape.

FIG. 17C illustrates the second electrodes 170 which are formed along the second semiconductor layer 150, creating a spiral shape. The second electrical connection 221 is provided for connection to these second electrodes 170.

As shown, a plurality of first electrodes 180 is arranged in a first region 131. If the first electrodes 180 are formed extensively, more light will be absorbed by them. Thus, the first electrodes 180 are preferably formed in dots. The first electrical connection 211 is provided for each of the first electrodes 180.

FIG. 18 shows examples of a first pad electrode 210 and a second pad electrode 220 of a semiconductor light emitting device 100 according to the present disclosure.

The second pad electrode 220 is formed on the insulating layer 160 and electrically connected to the second semiconductor layer 150 (see FIG. 17) included in the protruded parts 190 (see FIG. 17).

Figure 18A:
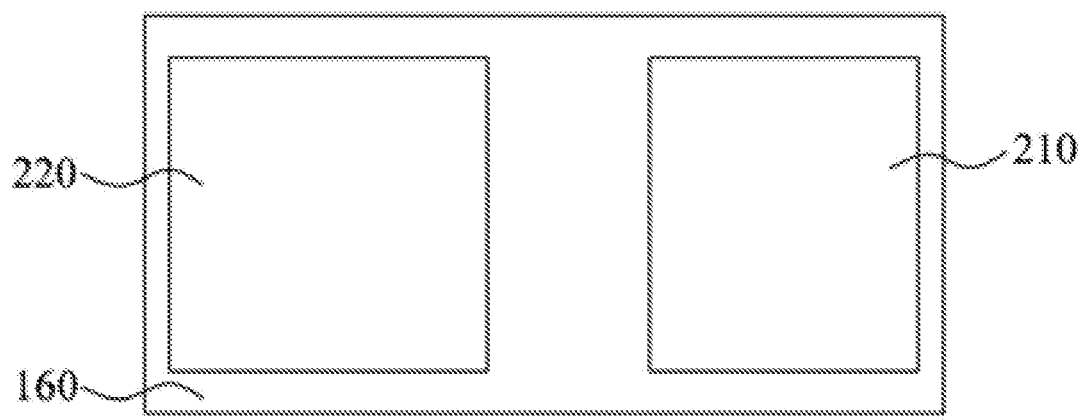
FIG. 18 shows examples of a first and a second pad electrode of a semiconductor light emitting device according to the present disclosure.

The second pad electrode 220 shown in FIG. 18A has a shape similar to the first electrode 210.

Figure 18B:
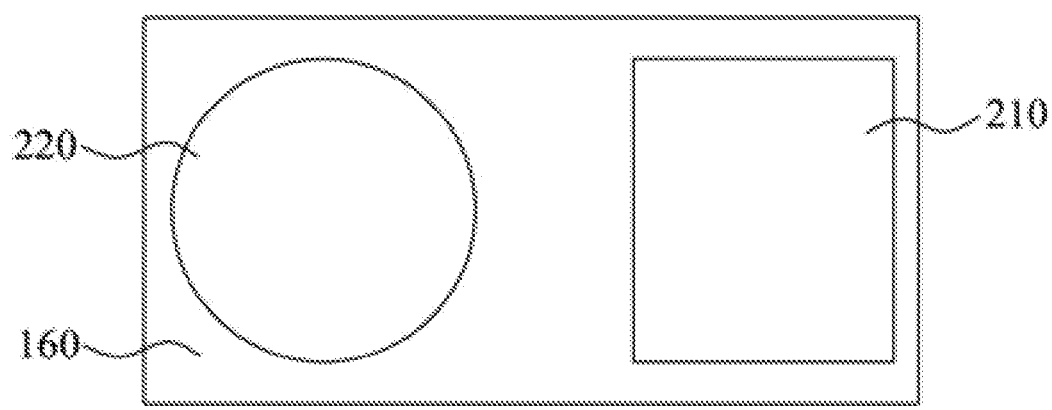

The second pad electrode 220 shown in FIG. 18B has a circular shape, as another example.

Figure 18C:
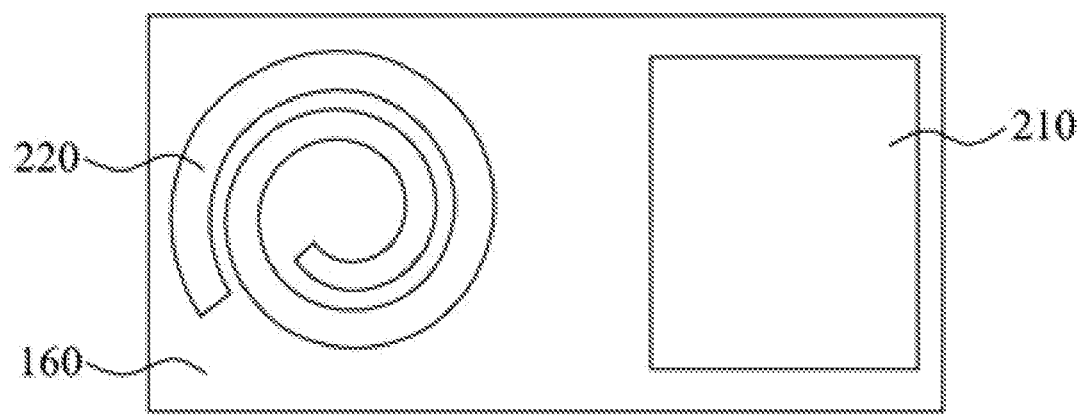

The second pad electrode 220 shown in FIG. 18C has a spiral shape, together with a plurality of protruded parts 190 formed along it. When the second pad electrode 220 is formed in a spiral shape, the insulating layer 160 is exposed between the second pad electrodes 220 so that light would not be absorbed all by the second pad electrodes 220 but forwarded further, escaping through between the second pad electrodes 220. Although not shown, the protruded parts 190 are actually formed along the spiral-shaped second pad electrode 220 (see FIG. 19).

FIG. 19 shows examples of a protruded part according to the present disclosure.

Figure 19A:
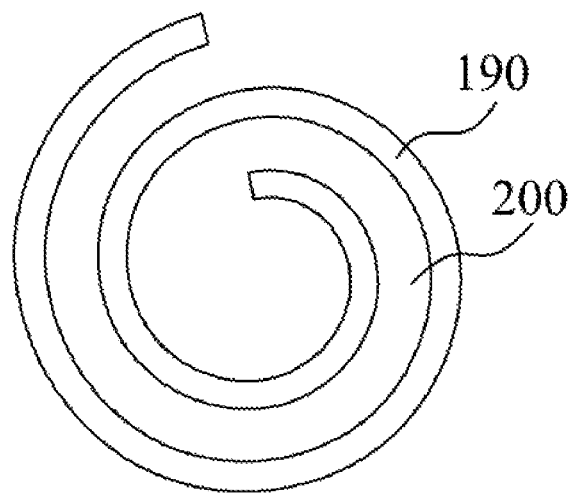
FIG. 19 shows examples of a protruded part according to the present disclosure.
Figure 19B:
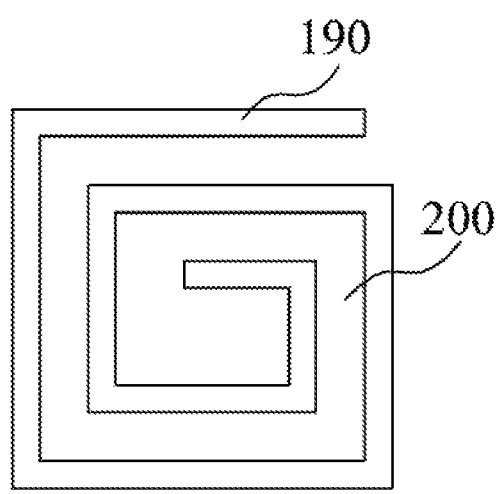

The cross-sectional views in FIGS. 19A to 19B illustrate spiral-shaped protruded parts 190 and recesses 200 as seen in plan view.

Figure 19C:
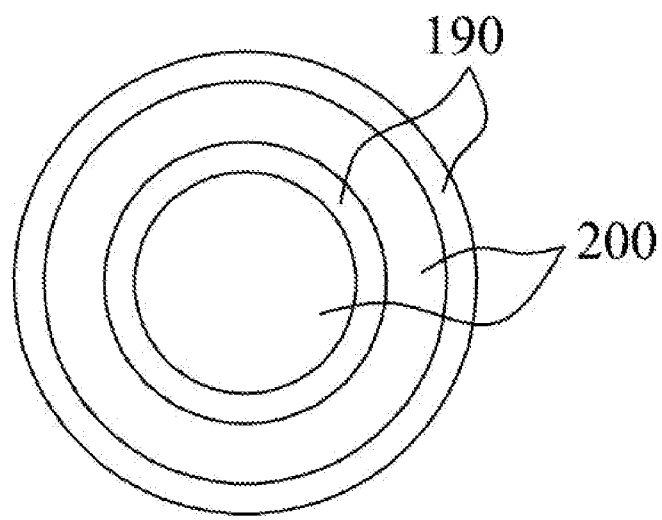
Figure 19D:
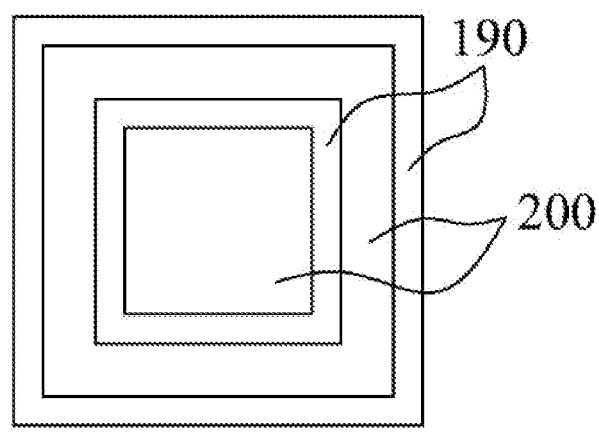

The cross-sectional views in FIGS. 19C to 19D illustrate closed-loop shaped protruded parts 190 and recesses 200 as seen in plan view.

Figure 19E:
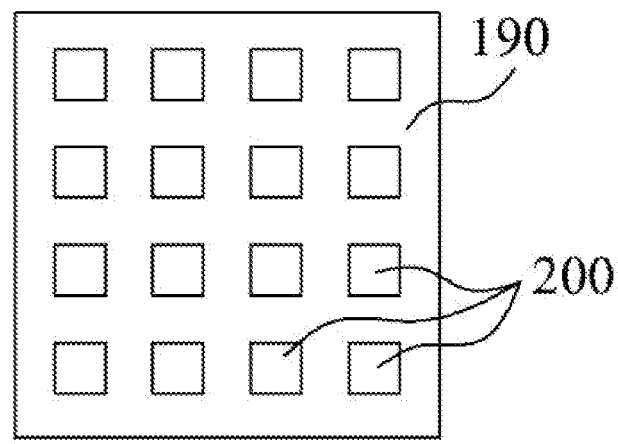

The cross-sectional view in FIG. 19E illustrates mesh-shaped protruded parts 190 and recesses 200 as seen in plan view.

Figure 20:
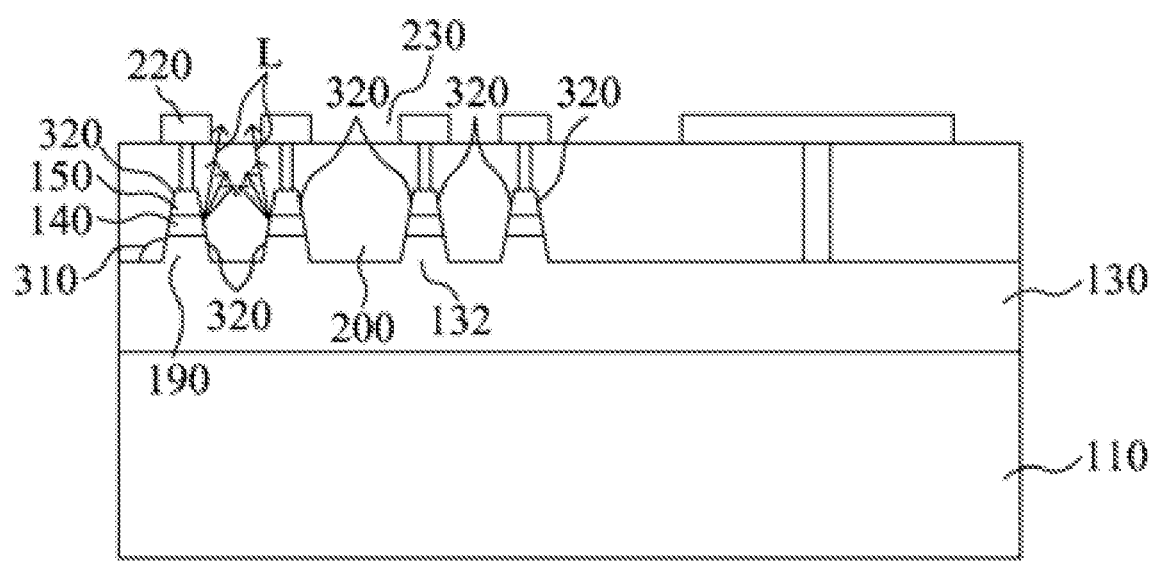
FIG. 20 shows another exemplary embodiment of a semiconductor light emitting device according to the present disclosure.

FIG. 20 shows another exemplary embodiment of a semiconductor light emitting device according to the present disclosure.

The exposed top surface of the first semiconductor layer 130 forms an obtuse angle with the lateral surface of the active layer 140. In other words, the protruded parts 190 may have inclined sides 320. Light emitted from the active layer 140 may be forwarded onto the top surface of the semiconductor light emitting device 100.

Not all of the ultraviolet light L is absorbed by the second pad electrode 220 but it partly escapes through the exposed part 230 out of the semiconductor light emitting device 100, increasing the efficiency of light emission.

Except for the features described above in this embodiment, the semiconductor light emitting device in FIG. 20 is substantially same as the semiconductor light emitting device in FIG. 12.

FIG. 21 shows yet another exemplary embodiment of a semiconductor light emitting device 100 according to the present disclosure.

Figure 21A:
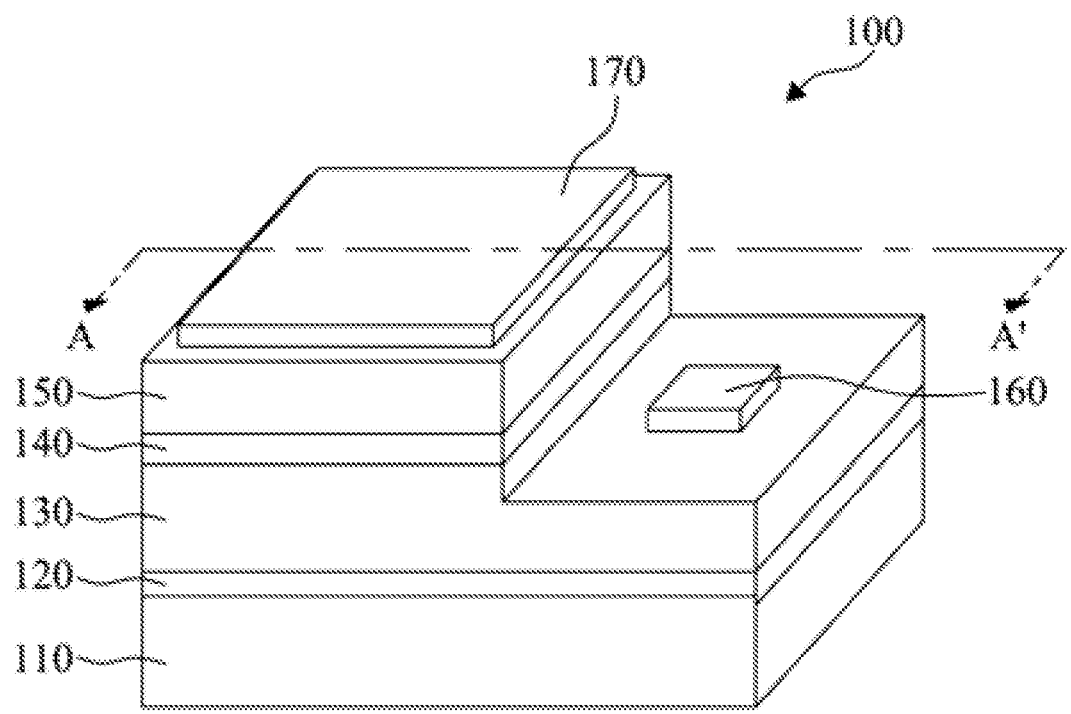
FIG. 21 shows yet another exemplary embodiment of a semiconductor light emitting device according to the present disclosure.
Figure 21B:
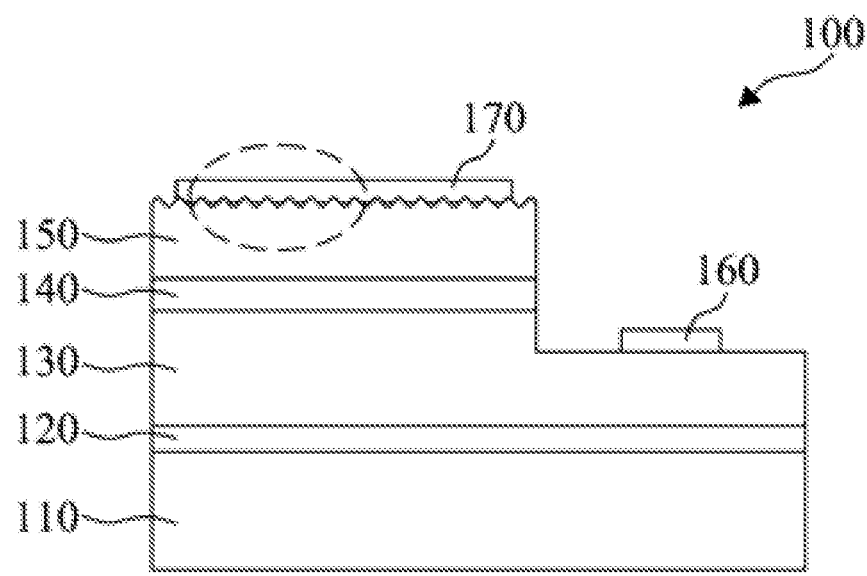

FIG. 21A is a perspective view, and FIG. 21B is a cross-sectional view taken along line AA" in FIG. 21A.

The semiconductor light emitting device 100 in this embodiment may include a growth substrate 110, a plurality of semiconductor layers 120, 130, 140, 150, and ohmic electrodes 160, 170.

The growth substrate 110 which is eventually removed is mainly a sapphire, SiC, Si, or GaN substrate.

The plurality of semiconductor layers includes a buffer layer 120 grown on the growth substrate 110, a first semiconductor layer 130 having a first conductivity (e.g. an n-type semiconductor layer), a second semiconductor layer 150 having a second conductivity different from the first conductivity (e.g. a p-type semiconductor layer), and an active layer 140 arranged between the first semiconductor layer 120 and the second semiconductor layer 150 for emitting light by electron-hole recombination. The buffer layer 120 may be omitted, and other layers (not shown) may additionally be included as needed. The semiconductor layers 120, 130, 140, 150 may be based on an aluminum gallium nitride (AlGaN) material, allowing the semiconductor light emitting device 100 to emit ultraviolet light, particularly, ultraviolet light having a shorter wavelength of 300 nm or less (e.g. UV-C in a wavelength range from 200 nm to 280 nm).

The ohmic electrodes may include a first ohmic electrode 160 and a second ohmic electrode 170.

The first ohmic electrode 160 may be made of any combination of Cr, Ti, Al, Ag, Ni, Pt, W, Au, and Rh. For example, the first ohmic electrode 160 is a stack of layers sequentially deposited, including an ohmic contact layer (e.g. Cr, Ti, Ni, etc.)/reflecting metal layer (e.g. Al, Ag, Rh, etc.)/first barrier (e.g. Ni, Cr, Ti, W, Pt, TiW, etc.)/anti-oxidation layer (e.g. Au, Pt, etc.)/second barrier (e.g. Cr, Ti, Ni, Pt, Al, etc.). The ohmic contact layer is made of a metal having a low work function to make ohmic contact with the first semiconductor layer 130. The reflecting metal layer reflects light to reduce absorption loss. The first barrier prevents diffusion between the reflecting metal layer and the anti-oxidation layer. The anti-oxidation layer can prevent oxidation of the first barrier, for example. Although not shown, a pad electrode may be formed on the first ohmic electrode 160, and if so, the pad electrode and the first ohmic electrode 160 can achieve good electrical contact together. The ohmic contact layer may have a thickness of 5 Å to 500 Å, the reflecting metal layer may have a thickness of about 500 Å to 10000 Å, the first barrier may have a thickness of about 100 Å to 5000 Å, and the antioxidant layer is 100 Å to 5000 Å The thickness may have a thickness of about 2 Å, and the second barrier may have a thickness of about 10 Å to 1000 Å. In this multilayer structure, the first ohmic electrode 160 may be partially omitted or a new layer may be added as needed.

The second ohmic electrode 170 may include multiple layers of any combination of Cr, Ti, Al, Ag, Ni, Pt, W, Au, and Rh. It is not absolutely required that the second ohmic electrode 170 and the first ohmic electrode 160 should have the same structure, but they may have similar structures. For example, the second ohmic electrode 170 may include a stack of contact/reflecting metal/first barrier/anti-oxidation/second barrier layers sequentially deposited. In case that the semiconductor light emitting device is a flip chip, the second ohmic electrode 170 preferably includes a reflecting layer to improve light extraction (or light outcoupling) efficiency. Although not shown, a pad electrode may also be formed on the second ohmic electrode 170 as needed.

In addition, a light-transmitting conductive film (not shown) may be formed between the second ohmic electrode 170 and the second semiconductor layer 150. In particular, when the second semiconductor layer 150 is based on p-type aluminum gallium nitride (AlGaN), it is preferable to provide a light-transmitting conductive film to enhance the current spreading capability. If the light-transmitting conductive film is too thin, the operating voltage can be increased due to poor current spreading. If the light-transmitting conductive film is too thick, however, the light extraction efficiency can be lowered due to light absorption. For example, the light-transmitting conductive film may be made of ITO, ZnO, or Ni/Au. Alternatively, it can be a reflecting conductive film based on Ag. However, this light-transmitting conductive film may cause a serious problem by absorbing ultraviolet light of a shorter wavelength band. Hence, as shown in FIG. 21, it is preferable that the second ohmic electrode 170 including a reflecting layer covers most of the second semiconductor layer 150. More preferably, the second ohmic electrode 170 covers at least 90% of the top surface of the second semiconductor layer 150.

In particular, in the present disclosure, the second ohmic electrode 170 has an increased reflection efficiency, which could be achieved by providing irregularities to the top surface of the p-type AlGaN-based second semiconductor layer 150. This will be explained further with reference to FIG. 22.

Figure 22:
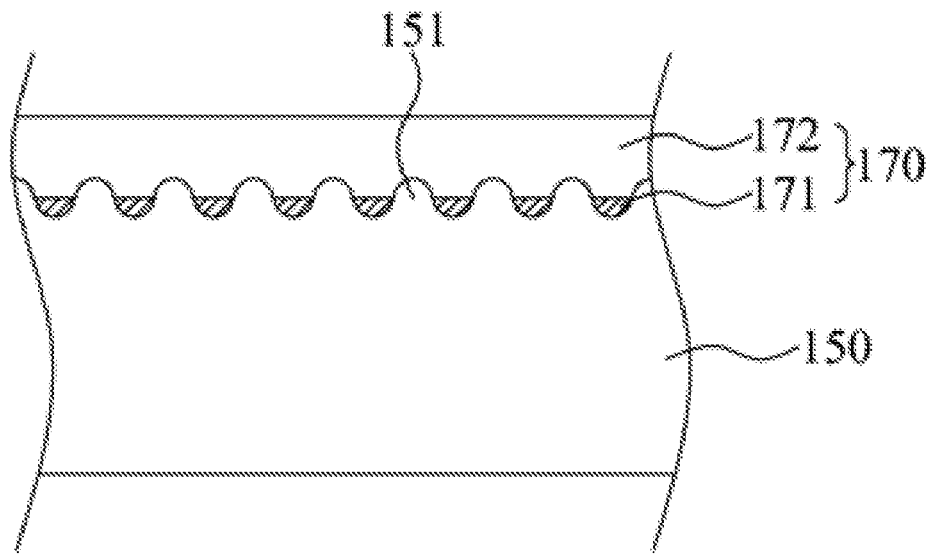
FIG. 22 illustrates technical benefits of the semiconductor light emitting device shown in FIG. 21.

FIG. 22 illustrates technical benefits of the semiconductor light emitting device shown in FIG. 21.

For a semiconductor ultraviolet light emitting device, the top surface of the p-type AlGaN-based second semiconductor layer 150 can have irregularities 151. The actual height of the irregularity ranges from 0 Å to 200 Å. For convenience of description, an enlarged view of the irregularities 151 in a dotted circle in FIG. 21B is provided in FIG. 22. Although only the ohmic contact layer 171 and the reflecting layer 172 are shown as the ohmic electrode 170, there may be more layers, as described above with reference to FIG. 21. The ohmic contact layer 171 of the second ohmic electrode 170 is formed such that at least part of the irregularities 151 formed on the top surface of the p-type AlGaN-based second semiconductor layer 150 penetrate the ohmic contact layer 171 of the second ohmic electrode 170, and those irregularities 151 penetrated the ohmic contact layer 171 may come into direct contact with the reflecting layer 172 of the second ohmic electrode 170. If ultraviolet light has a shorter wavelength (e.g. UV-C), a large amount of the ultraviolet light can be absorbed by the ohmic contact layer 171 even when the ohmic contact layer 171 is very thin (e.g. between 5 Å and 500 Å). To reduce an amount of the ultraviolet light absorbed by the ohmic contact layer 171, therefore, part of the irregularities 151 formed on the top surface of the second semiconductor layer 150 should penetrate the ohmic contact layer 171, so that the ultraviolet light that had transmitted through the second semiconductor layer 150 may be incident directly on the reflecting layer 171 without passing the ohmic contact layer 171. One possible concern here is that if the reflecting layer 172 being partly in direct contact with the p-type AlGaN-based second semiconductor layer 150 has a work function higher than that of the second semiconductor layer 150, the operating voltage may be greatly increased. As such, the reflecting layer 172 is preferably made of a material having a high reflectance for ultraviolet light and a low work function (e.g. Rh). For example, if the reflecting layer 172 is based on aluminum (Al) which has a high reflectance for ultraviolet light and a high work function, a difference between the work function of Al and the work function of the p-type AlGaN-based second semiconductor layer 150 is large, and the operating voltage of the semiconductor light emitting device would be increased to 15 V or higher. Preferably, the difference between the work function of the p-type AlGaN-based second semiconductor layer 150 and the work function of a material of the reflecting layer is 2 eV or less. Moreover, when the reflecting layer 172 is made of a material having a low work function (e.g. Rh, Ni, Pt, Pd, Au), the ohmic contact layer 171 is preferably made of a material having excellent bonding strength with the material of the reflecting layer 172. For example, if the reflecting layer 172 is made of Rh, the ohmic contact layer 171 is preferably made of Ni because Ni, as compared with Cr, has a work function not much different from the work function of the Rh-based reflecting layer 172 with a high reflectance for ultraviolet light. Moreover, a preferable thickness of the ohmic contact layer 171 is 10 Å or less, in order to allow the part of the irregularities 151 of the p-type AlGaN-based second semiconductor layer 150 to be able to penetrate the ohmic contact layer 171. Meanwhile, the ohmic contact layer 171 should be at least 300 Å thick, in order to keep the part of the irregularities 151 of the p-type AlGaN-based second semiconductor layer 150 from penetrating the ohmic contact layer 171.

FIG. 23 shows an exemplary embodiment of a method for manufacturing the semiconductor light emitting device shown in FIG. 21.

Figure 23A:
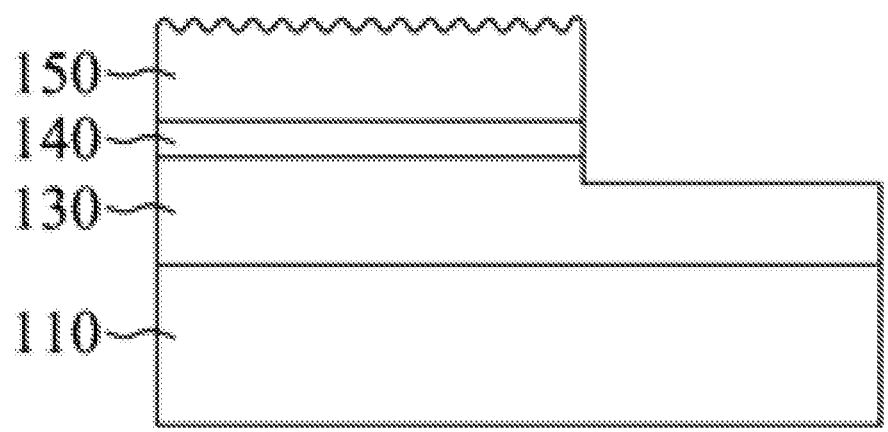
FIG. 23 shows an exemplary embodiment of a method for manufacturing the semiconductor light emitting device shown in FIG. 21.

Referring first to FIG. 23A, the first semiconductor layer 130, the active layer 140, and the second semiconductor layer 150 are sequentially formed on the growth substrate 110. Then, the second semiconductor layer 150 and the active layer 140 are mesa-etched to expose the first semiconductor layer 130. A dry etching method, for example, ICP (Inductively Coupled Plasma) may be used for removing multiple semiconductor layers. A process for etching a portion of the semiconductor layers 130, 140, 150 is well known to those skilled in the art.

Figure 23B:
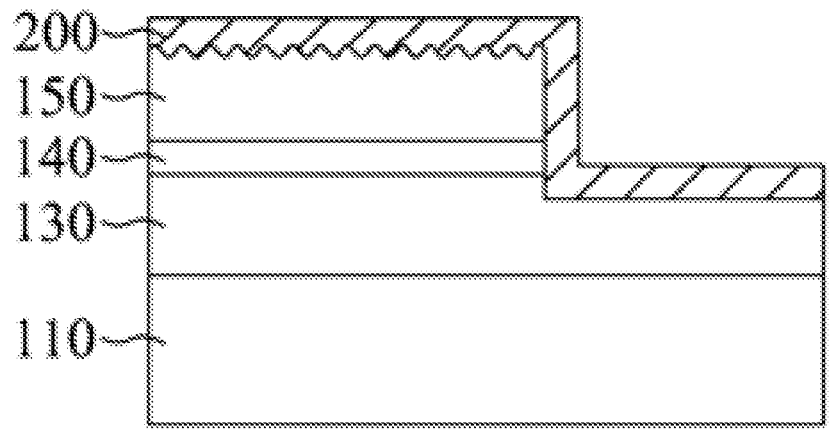

Next, referring to FIG. 23B, a protective layer 200 is formed on the exposed first semiconductor layer 130 and the second semiconductor layers 150. The protective layer 200 is preferably formed in a single layer structure, but optionally or additionally, it may be formed in a multi-layer structure. The protective layer 200 may be made of an insulating material, such as $SiO_2$, $TiO_2$, or $SiN_x$. In the present disclosure, the protective layer 200 has a thickness of 10 μm or less. For example, when the protective layer 200 is thicker than 10 μm, it might not be easy to remove the protective layer 200 from the second semiconductor layer 150, on which the second ohmic electrode 170 needs to be formed next. Therefore, the protective layer 200 should be 10 μm or less in thickness. Further, the protective layer 200 should be formed after the etching process described in FIG. 23A had been carried out because if the protective layer is formed before the etching process, it might not be possible to obtain clean-cut cross sections during the etching process later on.

The protective layer 200 is formed by PECVD (Plasma Enhanced Chemical Vapor Deposition), LPCVD (Low Pressure Chemical Vapor Deposition), sputtering, E-beam evaporation, or thermal evaporation, in order to cover the semiconductor layers 130, 140, 150.

Figure 23C:
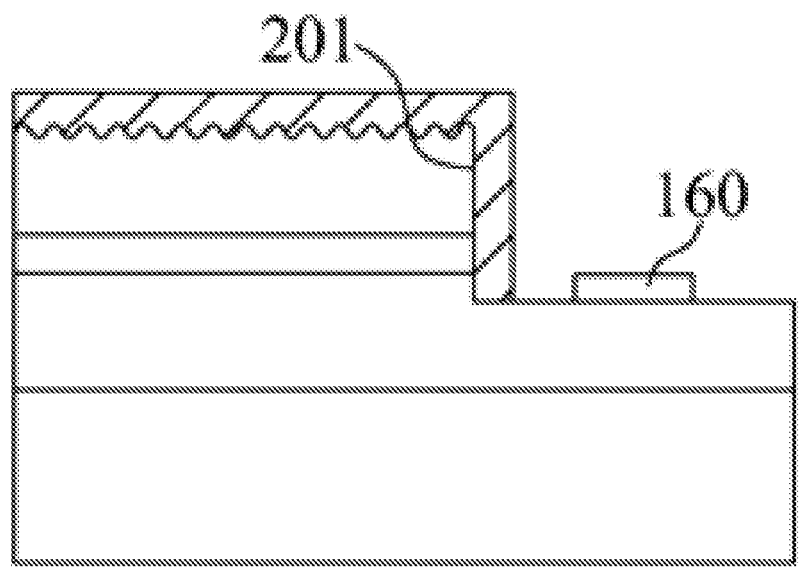

Continuing to FIG. 23C, a portion of the protective layer 200 is removed to form the first ohmic electrode 160 on the exposed first semiconductor layer 130. This needs to be done with caution as the protective layer 200 formed on the second semiconductor layer 150 as well as the protective layer 200 formed on the lateral surface 201 facing the first semiconductor layer 130 among those lateral surfaces of the second semiconductor layer 150 and the active layer 140 should not be removed. The first ohmic electrode 160 can be formed by sputtering, electron beam evaporation, or thermal evaporation.

Figure 23D:
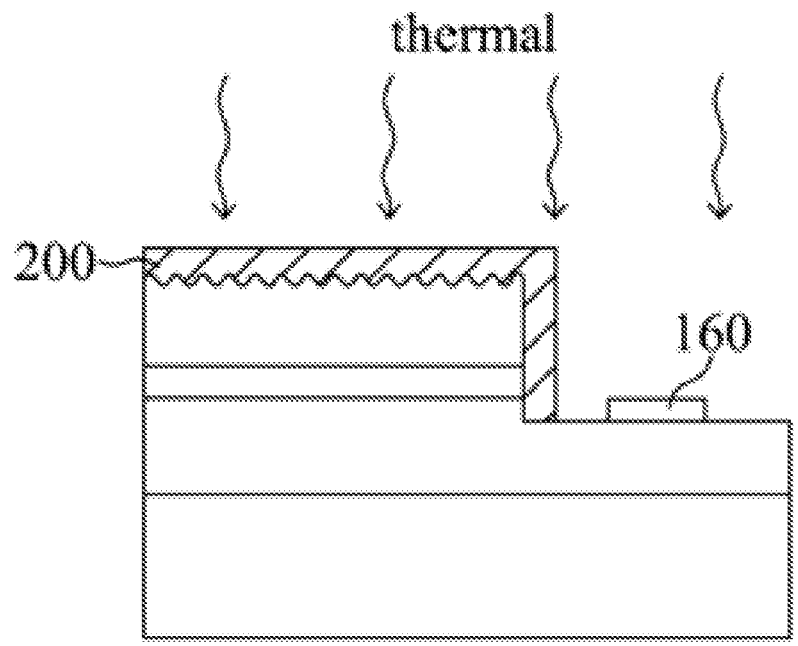

Referring next to FIG. 23D, the semiconductor layers 130, 140, 150 and the first ohmic electrode 160 are thermally treated at a high temperature. The heat treatment of the semiconductor layers 130, 140, 150 and the first ohmic electrode 160 may be performed simultaneously with the formation of the first ohmic electrode 160. As a result, a contact resistance between the first ohmic electrode 160 and the first semiconductor layer 130 decreases, lowering the operating voltage of the semiconductor light emitting device 100. In the present disclosure, the heat treatment is carried out under nitrogen atmosphere at 900° C. to 1000° C. for 30 seconds to 3 minutes. This is because when the first semiconductor layer is based on an n-type AlGaN, an ultra-high temperature treatment of at least 900° C. is required for inter diffusion of the metals to increase the n-type electron concentration within the first semiconductor layer. Meanwhile, no heat from the high-temperature heat treatment of 900° C. or higher is transferred to the second semiconductor layer 150 which is being protected by the protecting layer 200, preventing the extinction of holes.

Figure 23E:
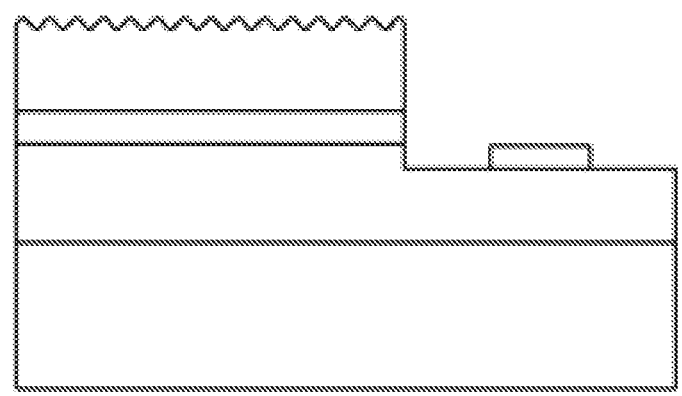

Next, the protective layer 200 is completely removed as shown in FIG. 23E.

Figure 23F:
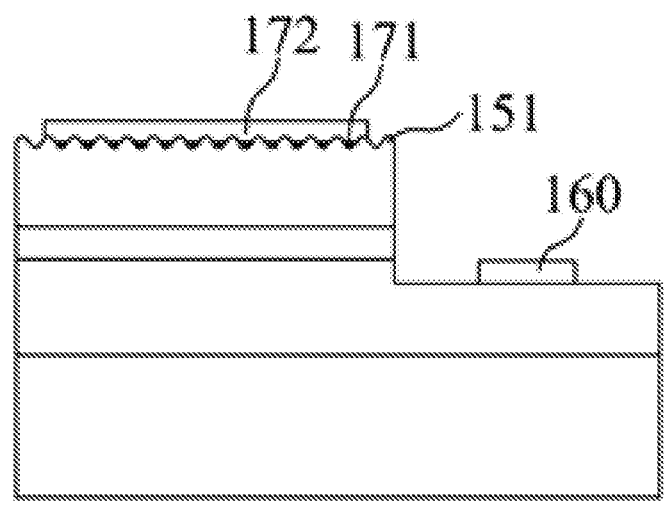

Finally, referring to FIG. 23F, the second ohmic electrode 170 is formed on the second semiconductor layer 150. The second ohmic electrode 170 is formed by sputtering, electron beam evaporation, or thermal evaporation, using same or different techniques used for forming the first ohmic electrode 160. As mentioned earlier, though, the ohmic contact layer 171 of the second ohmic electrode 170 is formed such that it can be penetrated by a part of the irregularities 151 on the p-type AlGaN-based second semiconductor layer 150. Thereafter, the reflecting layer 172 is formed on the ohmic contact layer 171, making direct contact with the part of the irregularities 151 of the second semiconductor layer 150. Other ohmic electrode layers may be formed later on, as needed. Unlike the n-type AlGaN-based semiconductor layer, the p-type AlGaN-based second semiconductor layer 150 does not have to undergo high-temperature heat treatment. It can be treated at a temperature of about 600° C. or lower, and preferably at 400° C. under nitrogen atmosphere for 1 minute. While FIG. 23 shows the protective layer 200 formed directly on the first and second semiconductor layers 130, 150, other layers may be formed between the protective layer 200 and the first and second semiconductor layers 130, 150.

Figure 1:
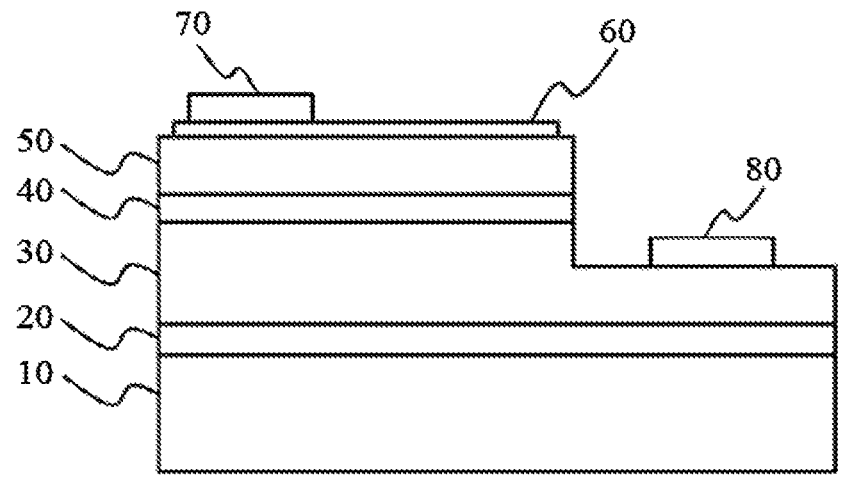
FIG. 1 shows an example of a semiconductor light emitting device in the art.
Figure 2:
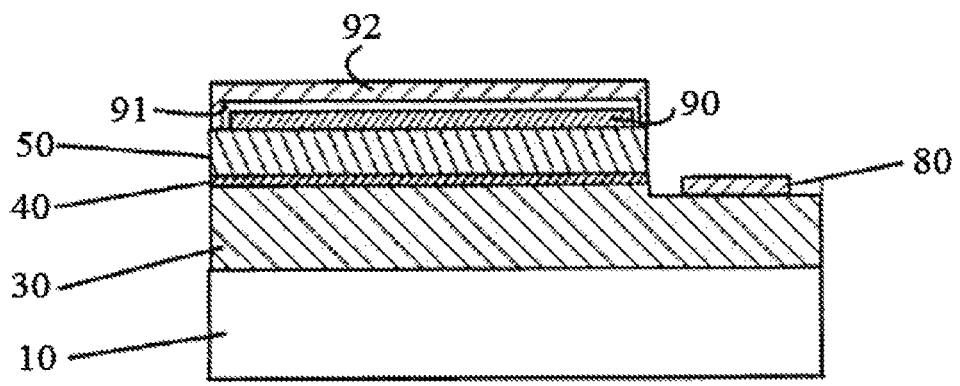
FIG. 2 shows another example of a semiconductor light emitting device disclosed in U.S. Pat. No. 7,262,436.
Figure 3:
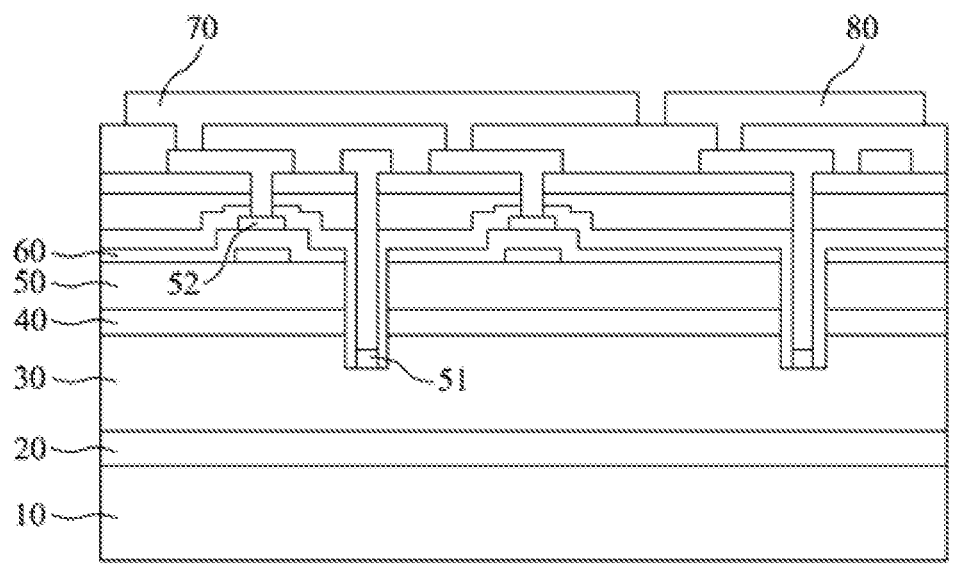
FIG. 3 shows another example of a semiconductor light emitting device disclosed in Korean Patent Application Laid-Open No. 2015-0055390.
Figure 4A:
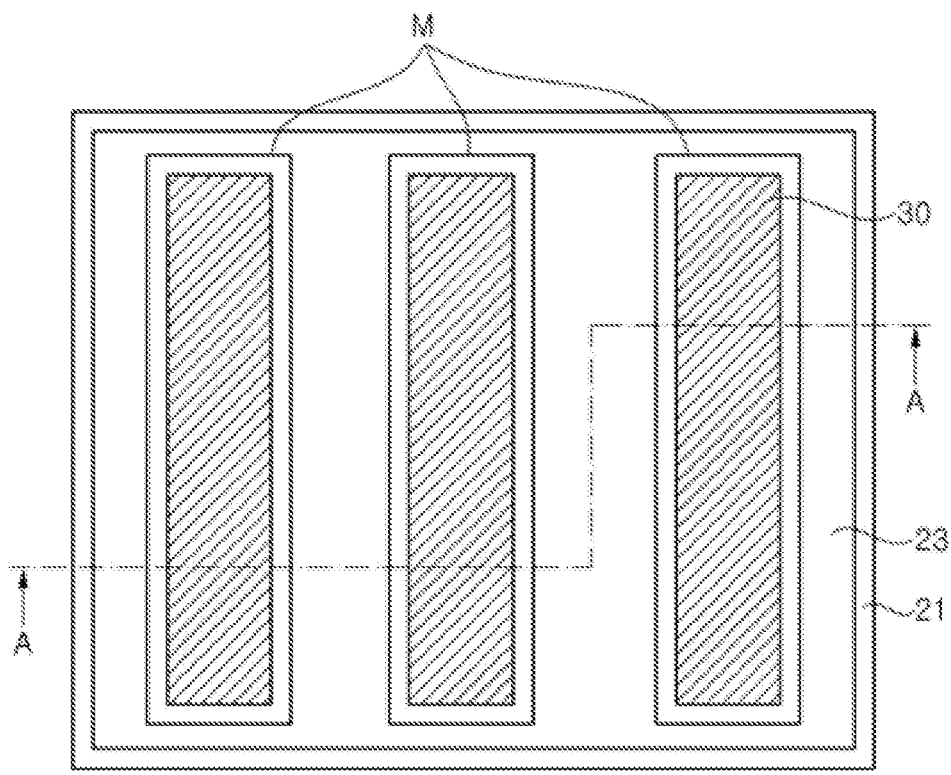
FIG. 4 shows another example of a semiconductor light emitting device disclosed in Korean Patent Application Laid-Open No. 2014-0073160.
Figure 4B:
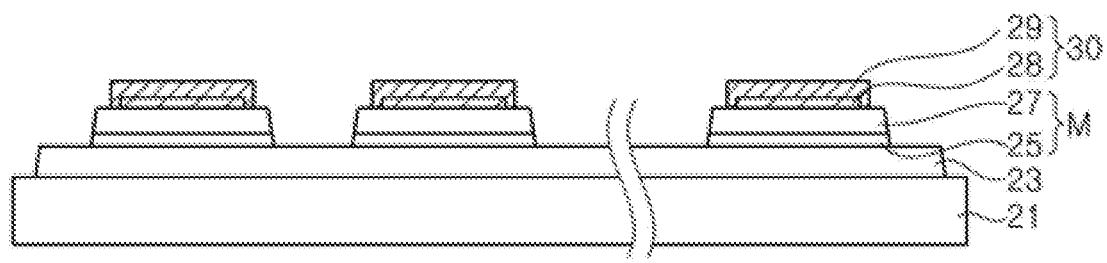

The semiconductor light emitting devices according to the present disclosure and their manufacturing methods can be applied to all semiconductor light emitting devices including ohmic electrodes. For example, the ohmic electrode structure according to the present disclosure can equally be applied to the semiconductor light emitting devices described in FIGS. 1 to 3 during the formation of ohmic electrodes therein. The ohmic electrode structure according to the present disclosure is particularly applicable to a semiconductor ultraviolet light emitting device, or a semiconductor light emitting device to be more specific that emits UVC having a shorter wavelength. Steps or processes in the methods for manufacturing a semiconductor light emitting device according to the present disclosure can be performed in any modified order available to those in the skilled in the art within the scope of the present disclosure.

Set out below are clauses that describe diverse features of further aspects of the present disclosure.

(1) A semiconductor light emitting device comprising: a substrate; a first semiconductor layer, which is provided on the substrate and has a first conductivity; an active layer, which is provided on the first semiconductor layer and generates ultraviolet light by electron-hole recombination; a second semiconductor layer, which is provided on the active layer and has a second conductivity different from the first conductivity; a first electrode electrically connected to the first semiconductor layer; a second electrode electrically connected to the second semiconductor layer; a second region that includes a plurality of protruded parts of the active layer and the second semiconductor layer protruded from the first semiconductor layer as seen in cross-sectional view and recesses between the protruded parts; and a first region surrounding the second region.

(2) There is also provided, the semiconductor light emitting device of clause (1) further comprising: an insulating layer formed on the first semiconductor layer, the second semiconductor layer, and the active layer; a first pad electrode, which is formed on the insulating layer and electrically connected to the first semiconductor layer; and a second pad electrode, which is formed on the insulating layer and electrically connected to the second semiconductor layer.

(3) There is also provided, the semiconductor light emitting device of clause (1) wherein the plurality of protruded parts and the recesses are formed in a spiral shape as seen in plan view.

(4) There is also provided, the semiconductor light emitting device of clause (1) wherein the plurality of protruded parts and the recesses are formed in a closed-loop shape as seen in plan view.

(5) There is also provided, the semiconductor light emitting device of clause (1) wherein the plurality of protruded parts and the recesses are formed in a mesh shape as seen in plan view.

(6) There is also provided, the semiconductor light emitting device of clause (1) wherein the second electrode is formed in dots in the protruded parts.

(7) There is also provided, the semiconductor light emitting device of clause (1) wherein the second electrode is formed along the protruded parts.

(8) There is also provided, the semiconductor light emitting device of clause (1) wherein a top surface of the first semiconductor layer and a lateral surface of the active layer in the recess are arranged at an obtuse angle.

(9) There is also provided, the semiconductor light emitting device of clause (1) wherein the second region is equal to or smaller than the first region in size.

(10) There is also provided, the semiconductor light emitting device of clause (2) further comprising: a second electrical connection formed between the plurality of protruded parts and the second pad electrode, with the second pad electrode being formed along the protruded parts.

(11) A semiconductor light emitting device comprising: a substrate; a first semiconductor layer, which is provided on the substrate and has a first conductivity; an active layer, which is provided on the first semiconductor layer and generates ultraviolet light by electron-hole recombination; a second semiconductor layer, which is provided on the active layer and has a second conductivity different from the first conductivity; a first electrode electrically connected to the first semiconductor layer; a second electrode electrically connected to the second semiconductor layer; an insulating layer formed on the first semiconductor layer, the second semiconductor layer, and the active layer; a first pad electrode, which is formed on the insulating layer and electrically connected to the first electrode; a second pad electrode, which is formed on the insulating layer and electrically connected to the second electrode; and an exposed part, in which the first semiconductor layer surrounds the active layer and the second semiconductor layer as seen in plan view, with the active layer and the second semiconductor layer forming a perimeter, and at least one of the first pad electrode and the second pad electrode is formed to expose the insulating layer, wherein the perimeter and the exposed part are at least partly overlapped as seen in plan view.

(12) There is also provided, the semiconductor light emitting device of clause (11) wherein the exposed part is at least partly overlapped with an exposed portion of the active layer as seen in plan view.

(13) There is also provided, the semiconductor light emitting device of clause (11) wherein the active layer has a lateral surface arranged at an obtuse angle with a top surface of the first semiconductor layer.

(14) There is also provided, the semiconductor light emitting device of clause (11) wherein the perimeter includes a first perimeter and a second perimeter, and a gap between the first perimeter and the second perimeter is at least partly overlapped with the exposed part as seen in plan view.

(15) There is also provided, the semiconductor light emitting device of clause (11) wherein the exposed part is formed on the first pad electrode and the second pad electrode, the first pad electrode being separated into a first external electrode and a first internal electrode by the exposed portion, the second pad electrode being separated into a second external electrode and a second internal electrode.

(16) There is also provided, the semiconductor light emitting device of clause (11) wherein the first external electrode is electrically connected to the first electrode, and the second internal electrode is electrically connected to the second electrode.

(17) There is also provided, the semiconductor light emitting device of clause (11) wherein the second semiconductor layer has a top surface smaller than that of the active layer.

(18) A semiconductor light emitting device comprising: a substrate; a first semiconductor layer, which is provided on the substrate and has a first conductivity; an active layer, which is provided on the first semiconductor layer and generates ultraviolet light by electron-hole recombination; a second semiconductor layer, which is provided on the active layer and has a second conductivity different from the first conductivity; a first electrode electrically connected to the first semiconductor layer; a second electrode electrically connected to the second semiconductor layer; and a plurality of regions, in which the first semiconductor layer surrounds the active layer and the second semiconductor layer, with the active layer and the second semiconductor layer forming a perimeter, and in which the active layer at a predefined distance away from the perimeter does not emit ultraviolet light, wherein a passage is present between the regions that has a width smaller than minimum width of the perimeter, passing by the regions.

(19) There is also provided, the semiconductor light emitting device of clause (18) wherein the perimeter has rounded junctions.

(20) There is also provided, the semiconductor light emitting device of clause (18) further comprising: an insulating layer formed on the first semiconductor layer, the second semiconductor layer and the active layer; a first pad electrode, which is formed on the insulating layer and electrically connected to the first electrode; and a second pad electrode, which is formed on the insulating layer and electrically connected to the second electrode.

(21) There is also provided, the semiconductor light emitting device of clause (18) wherein the active layer has a lateral surface arranged at an obtuse angle with a top surface of the first semiconductor layer.

(22) There is also provided, the semiconductor light emitting device of clause (18) wherein at least one of the regions is present in an area of the perimeter of maximum width.

(23) There is also provided, the semiconductor light emitting device of clause (18) wherein the plurality of regions includes a first region, a second region, and a third region, and a passage is formed between the first region and the second region and between the second region and the third region, respectively.

(24) There is also provided, the semiconductor light emitting device of clause (18) wherein the plurality of regions is formed in a circular shape.

(25) There is also provided, the semiconductor light emitting device of clause (18) wherein the substrate is a light-transmitting substrate.

(26) There is also provided, the semiconductor light emitting device of clause (18) wherein the perimeter is at a predefined distance away from the plurality of regions, and the passage has a width less than twice the distance.

(27) A semiconductor light emitting device comprising: a substrate; a first semiconductor layer, which is provided on the substrate and has a first conductivity; an active layer, which is provided on the first semiconductor layer and generates ultraviolet light by electron-hole recombination; a second semiconductor layer, which is provided on the active layer and has a second conductivity different from the first conductivity; a first electrode electrically connected to the first semiconductor layer; and a second electrode electrically connected to the second semiconductor layer, wherein the first semiconductor layer surrounds the active layer and the second semiconductor layer as seen in plan view, the active layer and the second semiconductor layer form a perimeter, and the first electrode is formed not to be overlapped with an extension line along the longitudinal direction of the semiconductor light emitting device and the perimeter.

(28) There is also provided, the semiconductor light emitting device of clause (27) wherein the junction has a radius of curvature 303 between 15 µm and 50 µm.

(29) There is also provided, the semiconductor light emitting device of clause (27) wherein the perimeter has an ellipse shape.

(30) There is also provided, the semiconductor light emitting device of clause (27) wherein the first electrode is formed in dots.

(31) There is also provided, the semiconductor light emitting device of clause (27) wherein the second electrode is formed in dots.

(32) There is also provided, the semiconductor light emitting device of clause (27) wherein the first semiconductor layer is an n-type semiconductor layer, and the second semiconductor layer is a p-type semiconductor layer.

(33) There is also provided, the semiconductor light emitting device of clause (27) wherein at least one of the regions is at a predefined distance away from the perimeter where the active layer does not emit ultraviolet light, and a passage is present between the regions that has a width smaller than minimum width of the perimeter, passing by the regions.

(34) There is also provided, the semiconductor light emitting device of clause (33) wherein the perimeter is at a predefined distance away from the plurality of regions, and the passage has a width less than twice the distance.

(35) There is also provided, the semiconductor light emitting device of clause (33) wherein the perimeter has a maximum width sufficient to pass by the plurality of regions.

(35) A semiconductor light emitting device comprising: a plurality of semiconductor layers including a first semiconductor layer which has a first conductivity, a second semiconductor layer which has a second conductivity different from the first conductivity, and an active layer which is provided between the first semiconductor layer and the second semiconductor layer and generates ultraviolet light by electron-hole recombination, with the second semiconductor layer having irregularities on a top surface; and a second ohmic electrode electrically connected to the second semiconductor layer, with the second ohmic electrode including an ohmic contact layer formed on the second semiconductor layer and a reflecting layer formed on the ohmic contact layer, wherein at least a part of the irregularities formed on the top surface of the second semiconductor layer penetrate the ohmic contact layer and come in direct contact with the reflecting layer.

(37) There is also provided, the semiconductor light emitting device of clause (36) wherein the plurality of semiconductor layers is made of an AlGaN material.

(38) There is also provided, the semiconductor light emitting device of clause (36) wherein the ohmic contact layer is made of at least one of Ni, Cr, Ti, and an alloy thereof.

(39) There is also provided, the semiconductor light emitting device of clause (36) wherein the reflecting layer is made of at least one of Rh, Al, Ag, and an alloy thereof.

(40) There is also provided, the semiconductor light emitting device of clause (36) wherein the ultraviolet light has a wavelength ranging from 200 nm to 280 nm.

(41) There is also provided, the semiconductor light emitting device of clause (36) wherein the ohmic contact layer is made of Ni, and the reflecting layer is made of Rh.

(42) A method for manufacturing a semiconductor light emitting device, the comprising: forming a plurality of semiconductor layers that includes a first semiconductor layer having a first conductivity, a second semiconductor layer having a second conductivity different from the first conductivity, and an active layer which is provided between the first semiconductor layer and the second semiconductor layer and generates ultraviolet light by electron-hole recombination, wherein the plurality of semiconductor layers is made of an AlGaN material, and the second semiconductor layer is a p-type semiconductor layer having irregularities on a top surface thereof and is electrically connected to an ohmic electrode; forming an ohmic contact layer of the ohmic electrode such that at least a part of the irregularities formed on the top surface of the p-type semiconductor layer penetrate the ohmic contact layer; and forming a reflecting layer of the ohmic electrode such the irregularities penetrated the ohmic contact layer come in contact with the reflecting layer.

(43) There is also provided, the method for manufacturing a semiconductor light emitting device of clause (42) wherein the ohmic contact layer is made of Ni, and the reflecting layer is made of Rh.

As discussed in the foregoing description, the semiconductor light emitting device according to an exemplary embodiment of the present disclosure has an exposed part which contributes to an increased light emission efficiency.

The semiconductor light emitting device according to another exemplary embodiment of the present disclosure has a passage so that regions that do not emit ultraviolet light are reduced.

The semiconductor light emitting device according to another exemplary embodiment of the present disclosure has a structure for reducing damage to the semiconductor layers.

The semiconductor light emitting device according to another exemplary embodiment of the present disclosure has a high efficiency of UV extraction.

What is claimed is:

1. A semiconductor light emitting device comprising:
   a substrate;
   a first semiconductor layer, which is provided on the substrate and has a first conductivity;
   an active layer, which is provided on the first semiconductor layer and generates ultraviolet light by electron-hole recombination;
   a second semiconductor layer, which is provided on the active layer and has a second conductivity different from the first conductivity;
   a first electrode electrically connected to the first semiconductor layer; and
   a second electrode electrically connected to the second semiconductor layer;
   wherein the first semiconductor layer surrounds the active layer and the second semiconductor layer,
   wherein the active layer and the second semiconductor layer form a perimeter,
   wherein a plurality of regions of the active layer, in which the active layer at a predefined distance away from the perimeter does not emit ultraviolet light, are formed,
   wherein a passage is present between the regions that has a width smaller than a minimum width of the perimeter passing by the regions,
   wherein the perimeter is at the predefined distance away from the regions, and the width of the passage is less than twice the predefined distance, and
   wherein the minimum width of the perimeter and the width of the passage each correspond to a length between opposing edges of the perimeter.

2. The semiconductor light emitting device according to claim 1, wherein the perimeter has junctions, and wherein all of the junctions are rounded.

3. The semiconductor light emitting device according to claim 1, further comprising:
   an insulating layer formed on the first semiconductor layer, the second semiconductor layer and the active layer;
   a first pad electrode, which is formed on the insulating layer and electrically connected to the first electrode; and
   a second pad electrode, which is formed on the insulating layer and electrically connected to the second electrode.

4. The semiconductor light emitting device according to claim 1, wherein the active layer has a lateral surface arranged at an obtuse angle with a top surface of the first semiconductor layer.

5. The semiconductor light emitting device according to claim 1, wherein the second semiconductor layer has a top surface smaller than that of the active layer.

6. The semiconductor light emitting device according to claim 1, wherein at least one of the regions is present in an area of the perimeter of a maximum width.

7. The semiconductor light emitting device according to claim 1, wherein the plurality of regions includes a first region, a second region, and a third region, and a passage is formed between the first region and the second region and between the second region and the third region, respectively.

8. The semiconductor light emitting device according to claim 1, wherein the plurality of regions is formed in a circular shape.

9. The semiconductor light emitting device according to claim 1, wherein the substrate is a light-transmitting substrate.

* * * * *